(12) United States Patent  (10) Patent No.: US 7,402,507 B2
Standing et al.  (45) Date of Patent: Jul. 22, 2008

(54) SEMICONDUCTOR PACKAGE FABRICATION

(75) Inventors: Martin Standing, Tonbridge (GB); Mark Pavier, Felbridge (GB); Robert J. Clarke, Kent (GB); Andrew Sawle, East Grinstead (GB); Kenneth McCartney, Tunbridge Wells (GB)

(73) Assignee: International Rectifier Corporation, El Segundo, CA (US)

( * ) Notice: Subject to any disclaimer, the term of this patent is extended or adjusted under 35 U.S.C. 154(b) by 47 days.

(21) Appl. No.: 11/367,725

(22) Filed: Mar. 3, 2006

(65) Prior Publication Data

US 2006/0205112 A1  Sep. 14, 2006

Related U.S. Application Data

(60) Provisional application No. 60/658,607, filed on Mar. 4, 2005.

(51) Int. Cl.
*H01L 21/20* (2006.01)

(52) U.S. Cl. ...................................................... 438/584
(58) Field of Classification Search ....................... None
See application file for complete search history.

(56) References Cited

U.S. PATENT DOCUMENTS

| 4,124,411 | A | * | 11/1978 | Meuleman et al. | ........... | 136/258 |
| H000445 | H | * | 3/1988 | Bock et al. | .................... | 264/1.7 |
| 6,415,974 | B2 | * | 7/2002 | Jao | ............................ | 228/215 |
| 6,440,212 | B1 | * | 8/2002 | Hayes | ........................... | 117/54 |
| 2002/0186374 | A1 | * | 12/2002 | Little | ........................ | 356/400 |
| 2005/0172894 | A1 | * | 8/2005 | Farnworth | .................. | 118/712 |

* cited by examiner

*Primary Examiner*—Scott B. Geyer
(74) *Attorney, Agent, or Firm*—Ostrolenk, Faber, Gerb & Soffen, LLP

(57) ABSTRACT

A semiconductor package fabrication method in which drop on demand deposition of a drop on demand depositable material is used to prepare one component or a plurality of components of a semiconductor package or multi-chip module.

22 Claims, 21 Drawing Sheets

SEMICONDUCTOR PACKAGE FABRICATION

RELATED APPLICATION

This application is based on and claims benefit of U.S. Provisional Application Ser. No. 60/658,607, filed on Mar. 4, 2005, entitled DEPOSITING PASSIVATIONS USING JETTING TECHNOLOGY (INK-JETTING), to which a claim of priority is hereby made and the disclosure of which is incorporated by reference.

BACKGROUND OF THE INVENTION

The present invention relates to semiconductor package manufacturing and semiconductor packages.

To fabricate a semiconductor package typically the components thereof must be treated. For example, in U.S. application Ser. No. 11/138,141, assigned to the assignee of the present invention, a method of fabricating a package is disclosed in which the front surface of the semiconductor die is subjected to a multi-step process whereby it receives a passivation body before the die is assembled in a conductive can.

In a process according to the present invention, a drop on demand deposition technique is used to form a body on a semiconductor package component. A process according to the present invention can be used to form, for example, a passivation body on a surface of a semiconductor die, a dielectric body on a lead frame portion of a semiconductor package, and so on.

A major advantage of drop on demand deposition is the reduction in process steps. The following is a comparison of a prior art process to a typical drop on demand process:

| Prior Art | Drop on Demand |
|---|---|
| Spin on material | Print material |
| Dry volatiles from material | Dry material |
| UV expose | Cure material |
| Develop material | |
| Cure material | |

The prior art method is disadvantageous because: a) it requires more material than required for the final structure; b) the material has to be developed, which means there are significant costs associated with the chemistry and the waste produced; c) additional steps are required; d) photo-initiator systems for imaging can weaken the performance of the materials; e) damage or contamination on the photo tool can result in openings in the passivation which may present problems.

On the other hand, drop on demand deposition: reduces waste; reduces the number of steps; can treat surfaces that are not flat; can vary the thickness across the image in a single pass; is not as susceptible to contamination defects as the prior art.

Drop on Demand is known to be used in:
Component part marking;
Depositing dielectrics on plasma display panels;
Printed circuit board production and marking;
Fine geometry circuit track printing using precious and semi-precious metals.

However, a search has not revealed drop on demand deposition used for fabricating a semiconductor package component such as a semiconductor die, lead frame or the like.

Other features and advantages of the present invention will become apparent from the following description of the invention which refers to the accompanying drawings.

DETAILED DESCRIPTION OF EMBODIMENTS OF THE INVENTION

Figure 1:
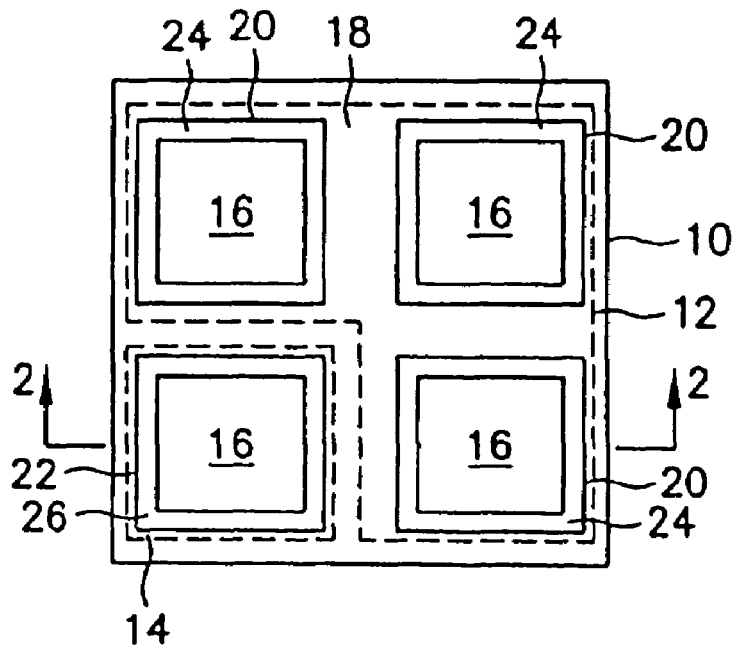
FIG. 1 shows a top plan view of a semiconductor package component prepared according to an embodiment of the present invention.
Figure 2:
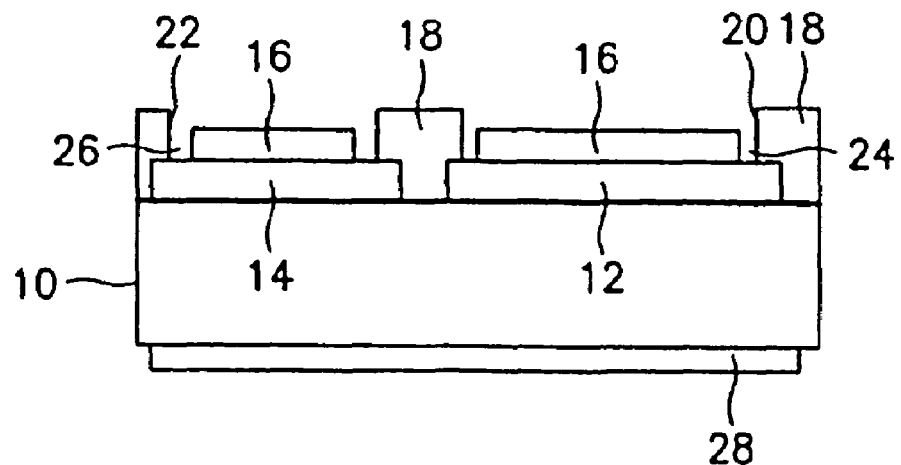
FIG. 2 shows a cross-sectional view of the component shown in FIG. 1 along line 2-2 and viewed in the direction of the arrows.

Referring to FIGS. 1 and 2, an example of a semiconductor package component fabricated according to the present invention includes a semiconductor die 10 having first power electrode 12 and control electrode 14 on a first major surface thereof. In the preferred embodiment, die 10 includes at least one solderable body 16 formed on first power electrode 12, at least one solderable body 16 formed on control electrode 14, and a passivation body 18 disposed on first power electrode 12 and control electrode 14. Passivation body 18 includes opening 20 to expose solderable body 16 on first power electrode 14 and opening 22 to expose solderable body 16 on control electrode 14. In the preferred embodiment, electrodes 12, 14 are formed from aluminum or aluminum silicon, and solderable bodies 16 are formed from a trimetal stack or any solderable material. The trimetal stack may include a silver layer at the top thereof, such as Ti/Pd/Ag trimetal stack.

Opening 20 may be wider than solderable body 16. As a result, solderable body 16 is spaced from passivation 18 by a gap 24 which surrounds solderable body 16. It should be noted that in the preferred embodiment, opening 22 may be also wider than solderable body 16 on control electrode 14 whereby gap 26 is created between passivation body 18 and solderable body 16 on control electrode 14. It should be noted, however, that in a semiconductor package component according to the present invention a gap between the solderable body 16 and passivation body 18 is not required. Thus, for example, each electrode 12, 14 may include a solderable body covering the entire surface thereof and passivation body 18 disposed over the solderable body. Other variations may also be implemented without deviating from the scope and the spirit of the present invention.

Preferably, passivation body 18 is thicker than solderable bodies 16. As a result, solderable bodies 16 do not extend beyond passivation body 18. That is, each solderable body 16 is preferably disposed at the bottom of its respective opening 20 and does not reach the top thereof.

A semiconductor package component according to the embodiment shown by FIGS. 1 and 2 can be of a vertical conduction variety and thus includes second power electrode 28 on the second major surface thereof opposite to the first major surface. For example, a component according to the embodiment shown by FIGS. 1 and 2 can be a power MOSFET in which first power electrode 12 is the source electrode, second power electrode 28 is the drain electrode, and control electrode 14 is the gate electrode.

Figure 3:
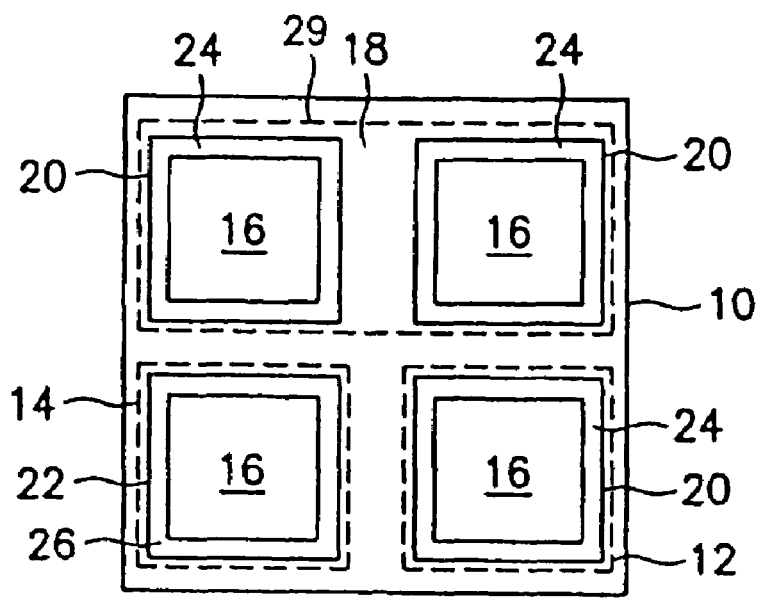
FIG. 3 shows a top plan view of another semiconductor package component prepared according to the present invention.

A component according to the present invention is not limited to vertical conduction type devices, however. Referring to FIG. 3, in which like numerals identify like features, a device according to the second embodiment may be of the flip-chip variety, in which case first power electrode 12, second power electrode 29, and control electrode 14 are disposed on a common surface of die 10. A component according to the second embodiment may be a power device such as a power MOSFET, in which case first power electrode 12 is the source electrode, second power electrode 29 is the drain electrode and control electrode 14 is the gate electrode.

Figure 4:
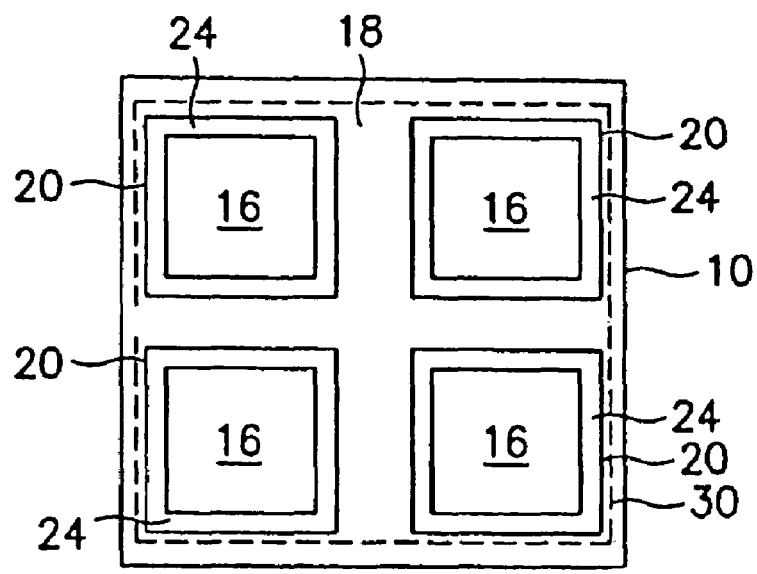
FIG. 4 shows a top plan view of another semiconductor package component prepared according to the present invention.

Referring next to FIG. 4, in which like numerals identify like elements, a semiconductor package component according to the third embodiment includes only a single power electrode 30 on a major surface thereof, and unlike the first embodiment and the second embodiment does not include a control electrode. A component according to the third embodiment can be, for example, a vertical conduction type diode in which one of its power electrodes (i.e., either the anode electrode or the cathode electrode) includes passivation body 18 on a surface thereof with openings over solderable bodies 16, each opening being wider than a respective solderable body 16 that it surrounds and passivation 18 being preferably thicker than solderable bodies 16.

All three embodiments are similar in that in each case all of the electrodes on one side are configured for direct connection with a conductive adhesive such as solder or conductive epoxy to a conductive pad on a substrate such as a circuit board. That is, solderable bodies 16 are provided on all electrodes on the same surface to allow for direct connection to a conductive pad on a substrate. Passivation body 18 thus protects the die, and may also serve as solder resist when the component is installed. Note that the present invention is not limited to the specific die described above but may be applied to high electron mobility transistors (HEMTs), such as GaN-based transistors, integrated circuits or the like.

A semiconductor device according to the present invention may be manufactured according to the following process.

Figure 5:
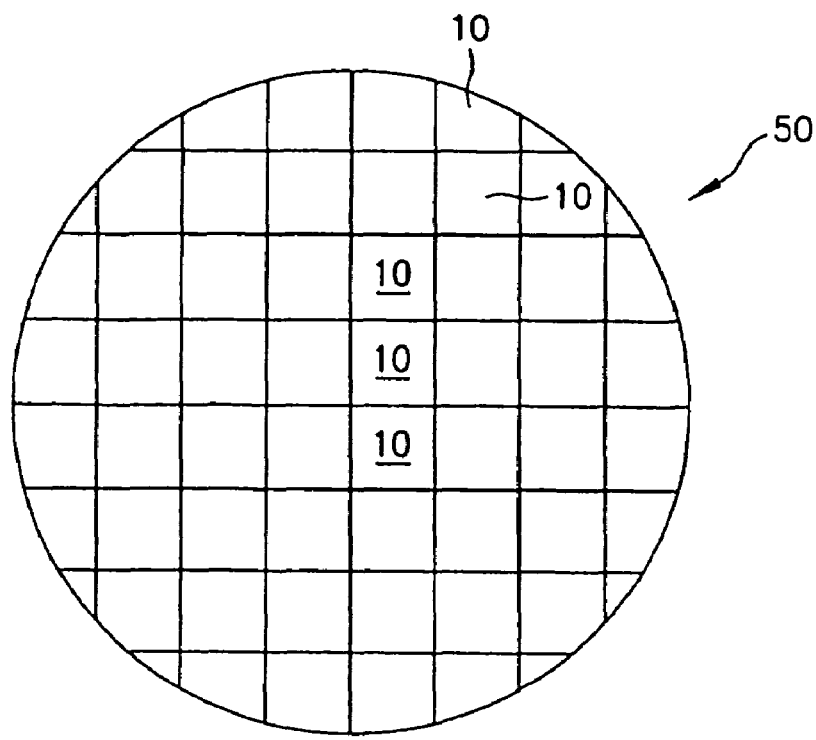
FIG. 5 shows a top plan view of a wafer having a plurality of die.

Referring to FIG. 5, first a plurality of die 10 are formed in a wafer 50 in a conventional manner. Thus, for example, in the preferred embodiment, a plurality of vertical conduction type power MOSFETs are formed in any known manner in a silicon wafer.

Figure 6:
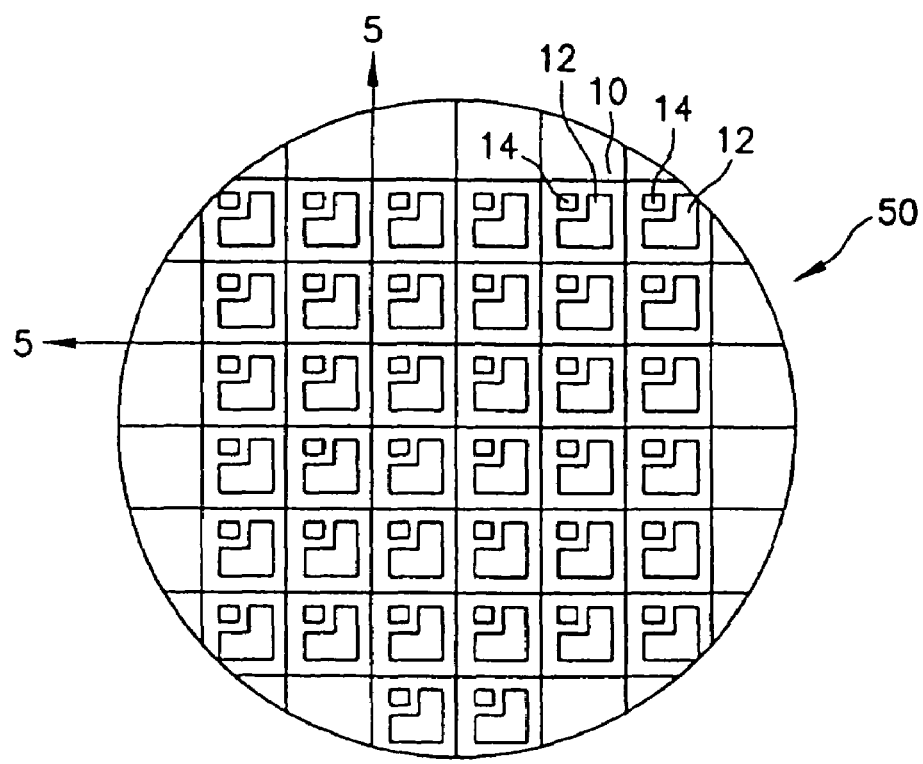
FIG. 6 shows a top plan view of a wafer having a plurality of die after electrodes have been formed thereon.

Next, a contact metal layer is deposited and patterned in any known conventional manner. Thus, in the preferred embodiment a front metal layer is deposited over wafer 50 in which the MOSFETs are formed, and patterned to form first power electrode 12 (hereafter source contact or source electrode) and control electrode 14 (hereafter gate contact or gate electrode) for each die 10 as shown by FIG. 6. A suitable front metal for this purpose may be Al or AlSi.

Next, a solderable front metal is deposited over the contact metal layer. The solderable front metal may be any suitable metal combination such as the trimetal combination Ti/Pd/Ag.

Figure 7:
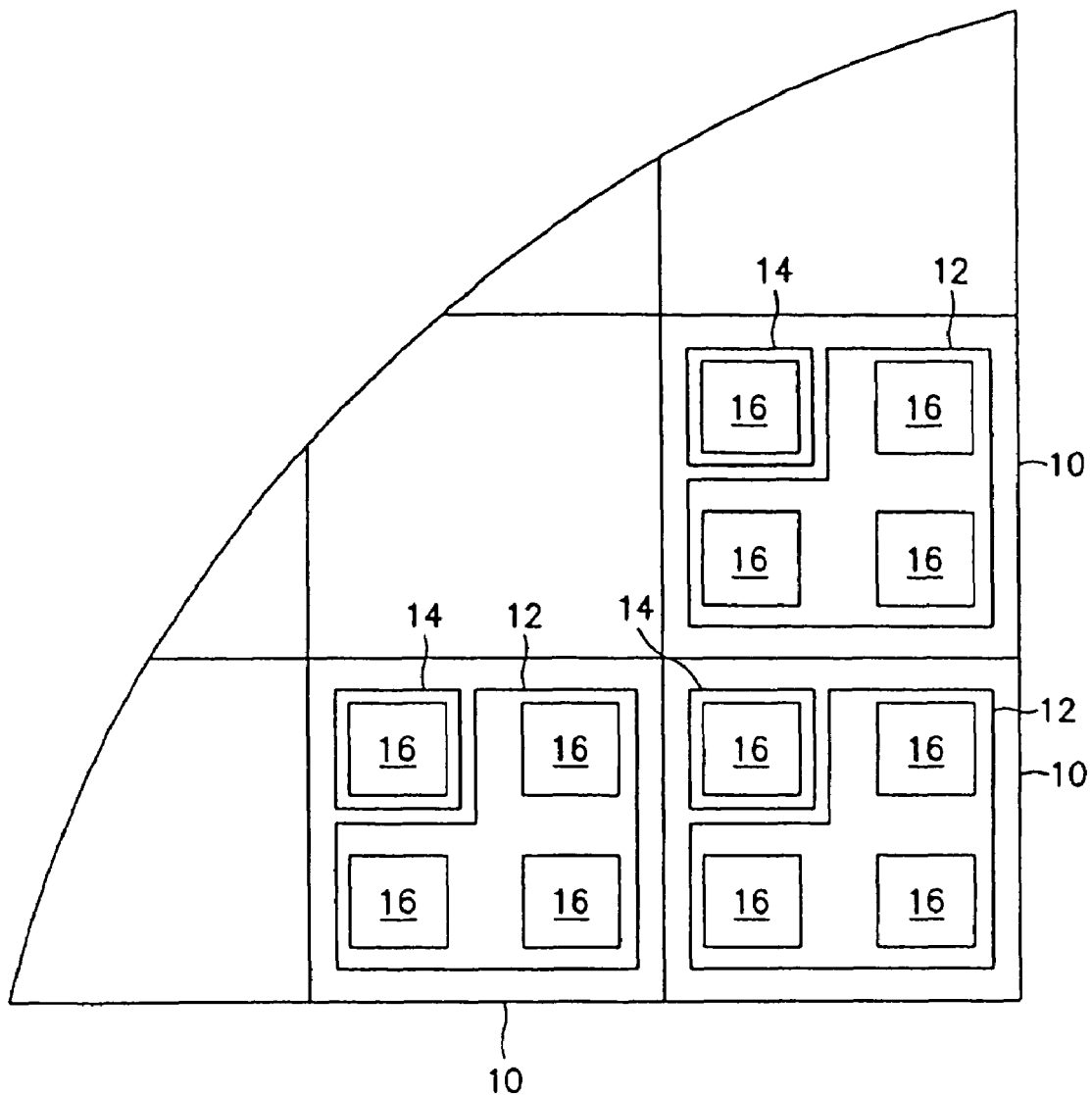
FIG. 7 shows portions 5-5 of the wafer in FIG. 4 after formation of a plurality of solderable layers.

Thereafter, the solderable front metal layer is patterned leaving at least one solderable body 16 over each contact e.g., source contact 12, as illustrated by FIG. 7. Thus, in the preferred embodiment, the solderable front metal is patterned to result in at least one solderable body 16 on gate electrode 14 and source electrode 12, or preferably a plurality of solderable bodies 16 over source electrode 12.

Thereafter, a back metal contact (not shown) is deposited over the back of the wafer 24 if such is required for a second power electrode for each die. Thus, for example, in the preferred embodiment, a drain back metal is formed in the back of the wafer. The drain back metal may be formed of Al or AlSi and further processed to include a solderable trimetal combination.

Figure 8:
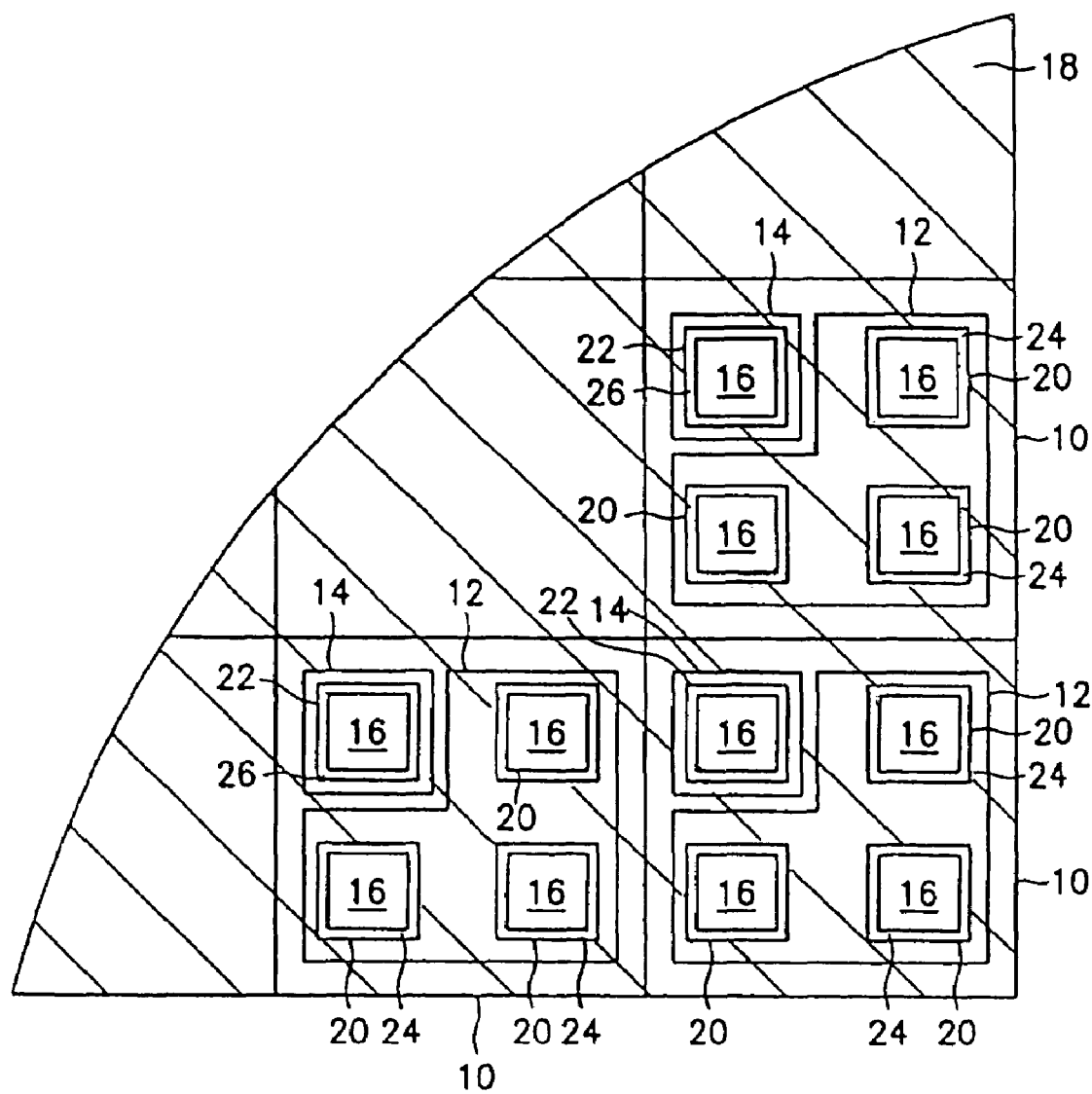
FIG. 8 shows portion 5-5 after formation of a passivation body according to an embodiment of the present invention.

Referring next to FIG. 8, according to the present invention, a passivation body 18 (illustrated by slanted lines) is formed over the front side of wafer 50 through drop on demand deposition of a drop on demand depositable material (depositable material) to form passivation body 18. Note that, according to the present invention, the depositable material will be deposited to have the desired pattern of passivation body 18 upon deposit. Thus, in the preferred embodiment, the depositable material will have openings 20, 22 as deposited. As a result, the process will eliminate the need for the multiple steps that are required in the prior art to obtain a passivation body patterned to include openings or the like. A semiconductor die manufactured according to the present invention can be assembled in a conductive can to obtain a package such as the one shown in U.S. patent application Ser. No 11/138,141.

Figure 9A:
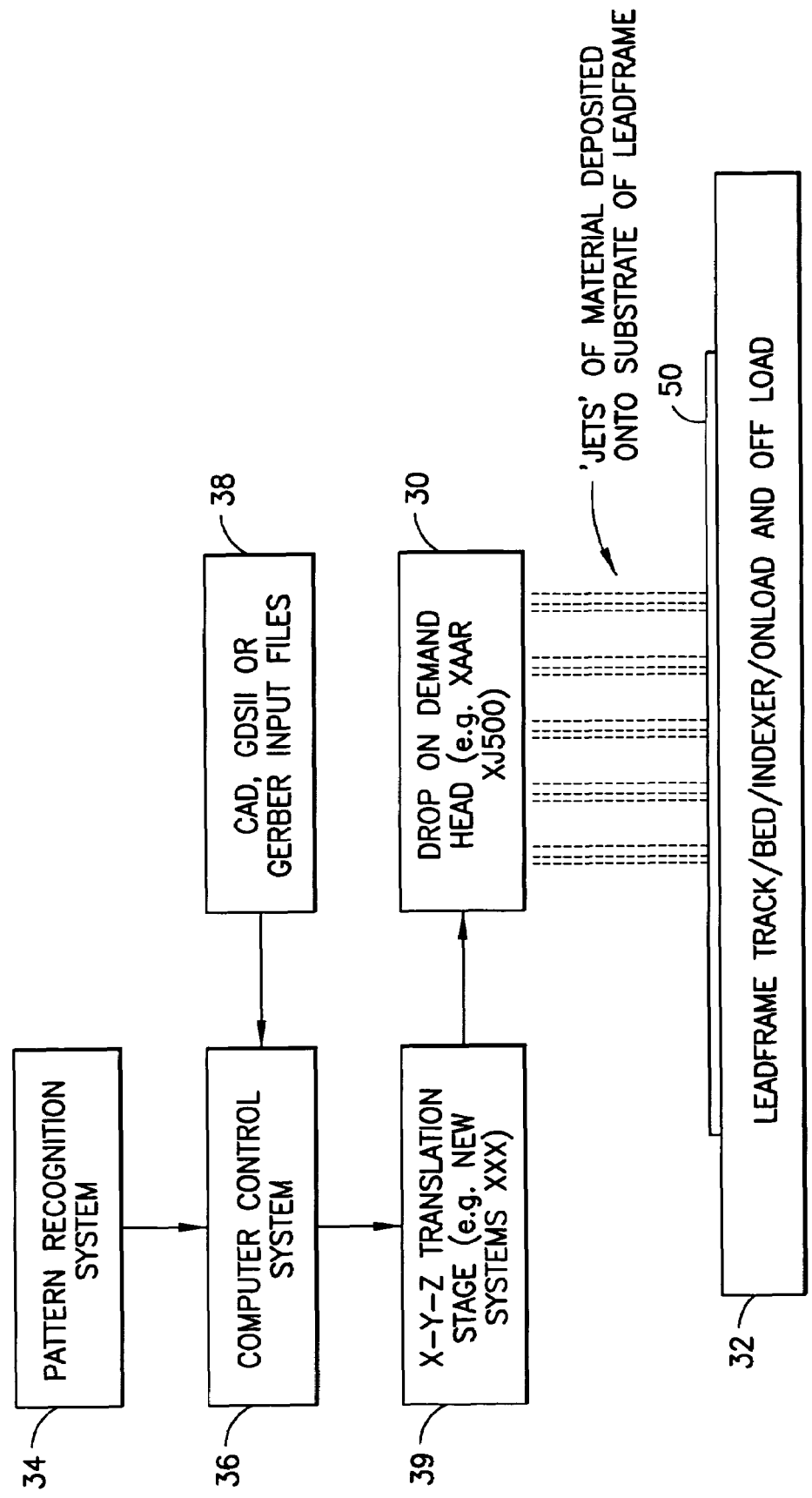
FIG. 9A illustrates an example of a system for carrying out a method according to the present invention.

FIG. 9 shows a schematic diagram of an example of a drop on demand system used in the of drop on demand deposition of a drop on demand depositable material, such as a depositable dielectric, onto a workpiece used in semiconductor packaging such as a leadframe. The system includes drop on demand head (print head) 30, a platform 32 for receiving the workpiece, a pattern recognition system 34, computer control system 36, pattern storage section 38, and translation stage 39.

Print head 30 deposits the depositable material on a workpiece (e.g. wafer 50) which resides on platform 32. Print head 30 preferably includes a piezo-pump, and a number of spaced nozzles preferably in a line across its width. The number of nozzles is dependent on the head type and is typically 100 or more. Through agitation of the piezo crystal of the piezo pump pressure is applied to the depositable material (which is in fluid form). As a result, the depositable material is forced through each nozzle in the print head and exits in the form of a droplet, which travels towards the workpiece (e.g. wafer 50, FIG. 6). To form a pattern the print head is traversed over the substrate. The print head driver circuitry individually controls each of the 100 or more individual jets to create the required pattern specified in the bitmap image file.

Print head 30 is preferably mounted onto a gantry to control its position relative to the work piece. The gantry may also be equipped with a camera, and/or UV or infra-red curing or dying unit.

The camera may serve as a part of pattern recognition system 34. The pattern recognition system is used to properly align pump head 30 to the workpiece. The camera provides alignment so that the workpiece may be aligned with the pattern that is to be printed on the workpiece. The alignment is ideally based on fiducials, which are generally unique features that are placed on the workpiece and the image solely for alignment purposes. A fiducial is typically a shape such as a cross, square, circle, etc. Natural features that occur on a product can sometimes be used as a fiducial, such as a gate pad, a corner, etc.

Computer control system 36 aligns print head 30 using an x-y-z translation stage and operates print head 30 in order to deposit a pattern on the workpiece based on an image stored in the image storage section 38. The image files may be stored in any format such as CAD files, GDSII or Gerber files. Preferably, the image file is in a gerber format and is converted into a bitmap prior to printing. Gerbers are a universal scale transport format used widely in printed circuit board manufacturing. A gerber can be produced by a variety of different CAD software and once created it becomes a universal file.

Each image file preferably includes a print layer (the layer containing the image to be printed into a pattern on the workpiece), a perimeter layer (a layer depicting the total size of the product and dictates the extreme of the printable area), and an alignment layer (which includes the fiducials that are positioned accurately to the print image). Only the print layer will actually be printed. Note that it may be possible to have more than one print layer.

The x-y-z translation system is based on the Cartesian system of spacial positioning. To be specific, as applied in the present invention, print head 30 and the workpiece are aligned relative to one another by moving platform 32 and/or print head 30 along one or both of the directions.

Figure 9B:
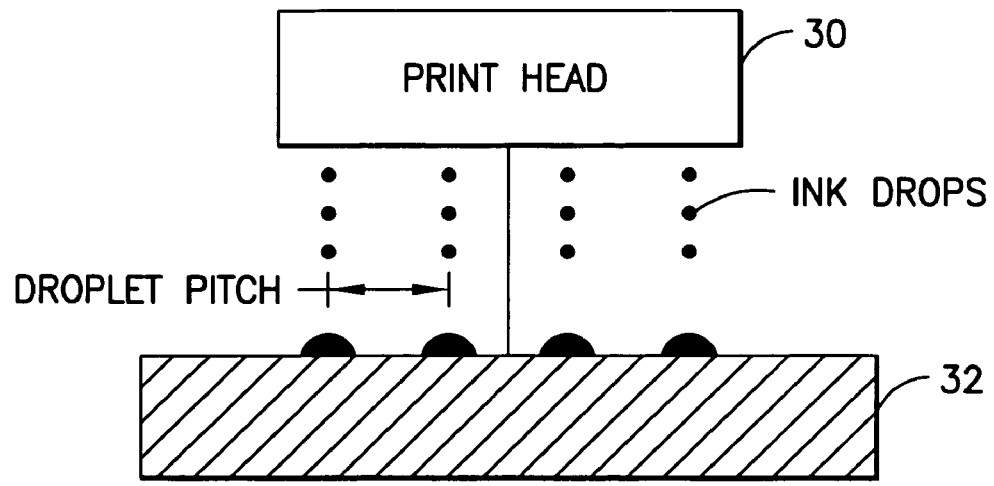
FIGS. 9B and 9C illustrate a deposition operation.
Figure 9C:
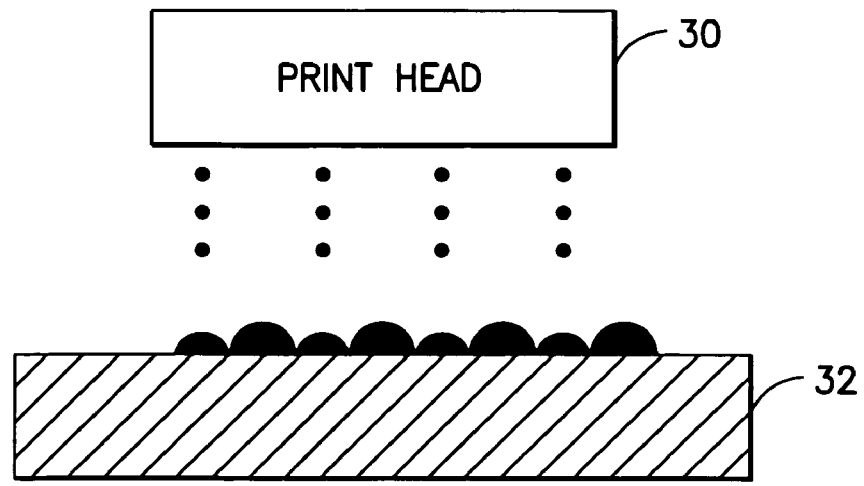

Referring to FIGS. 9B and 9C, for example, platform 32 (on which the workpiece is placed) moves only along the y axis (the axis coming out of the page); while, print head 30 is moveable along the x axis transverse to the y axis. In the preferred embodiment, the y axis is relevant for three reasons. First, platform 32 is moved along the y axis to position the workpiece under print head 30. Second, print head 30 is moved along the y axis when the required width of the area that is to receive the depositable material is greater than the width of the area coverable by one pass of print head 30. That is, the pattern cannot be realize in a single deposition step from one position of print head 30. Third, print head 30 can move in small increments in the direction of the y axis to allow the areas that would fall between the nozzles to be imaged by shifting the nozzle position relative to the workpiece slightly for each pass, whereby the resolution of the pattern can be improved. To deposit the drop on demand depositable material print head 30 moves in the direction of the x axis traversing the y axis. Thus, as illustrated by FIGS. 9B and 9C, a first array of droplets of the depositable material can first be deposited on the workpiece in one pass (see FIG. 9B). Then, print head 30 can be moved in the direction of the x axis by ½,¼, etc. of the nozzle pitch (distance between two neighboring nozzles) to fill the gap between the deposited droplets, whereby the density of the deposited droplets can be increased.

Once the workpiece is roughly aligned and secured to platform 32, the camera in the pattern recognition system 34 is directed toward a designated search area to look for the fiducials. As each physical fiducial is found the center and the coordinates are calculated. Thereafter, the platform is moved so that the fiducials on the workpiece and the image match, or the image is rasterised so that the fiducials of the image and the workpiece overly each other accurately. In practice, there are tolerances which means that each of the features on the frame are slightly inaccurate. Therefore, the coordinates are averaged out. As a result, the more fiducials there are, the less alignment errors appear. Typically, for speed and accuracy three or four fiducials are generally used usually placed at the extremes of the image to give the greatest distance between points to help with the accuracy.

The easiest way to visualize the process is to think about aligning two identical images, one on a transparency the other on paper. Features at the extremes of the image are the easiest to use to align by either moving the paper or by moving the transparency to align the images. There are two ways to align the images. First, the work may be aligned to the print image. Alternatively, the image may be rerasterized to align with the workpiece. The latter option is preferred.

A suitable machine for drop on demand deposition is a modified flat bed x-y system conventionally used in the printing of paper and textile substrates. These machines have been long used for processing of printed circuit boards, and have been found to be suitable for the processing of semiconductor package components according to the present invention.

The following is an example of how a method according to the present invention may be realized. First, a gerber file of a desired pattern is produced and stored as an image file in storage section 38. The gerber file is then loaded and converted to a bitmap and is then ready for printing.

The workpiece is then placed on platform 32. Once the print cycle is started the workpiece and the image are aligned by the camera using fiducials. A pattern corresponding to the image from the image file is then printed onto the workpiece by print head 30.

Note that the system may be further equipped with lamp units. The addition of the lamp units can offer benefits in some cases. For example, if the depositable material is UV based it can be either cured of fixed (fixed is a term used to describe a partial cure that thickens the material preventing flow) right after printing. If the material is non-UV, but includes a solvent it is possible to drive the solvent fully or partially right after printing. In both cases, a lamp is preferably mounted in close proximity to print head 30 and is turned on during the print cycle.

A preferred material to serve as the depositable material for forming passivation 18 is an organic passivation that has low moisture uptake, high adhesion, resistance to delamination in high humidity and temperature (THB), high temperature resistance, solvent resistance and chemical resistance.

All of these properties do not necessarily exist in a single material type. Basic materials have been studied for their respective properties and it has been found that the depositable material should be predominantly based on an organopolysiloxane (silicon resin). Organopolysiloxanes have good moisture uptake values and good high temperature stabilities. Thus, material development has been undertaken to produce a material based on the organopolysiloxane, which could meet the requirements set forth above. Based on experimental evaluations, silicon-epoxy and silicon-polyester have shown advantages over other organic silicon resins.

In developing a proper depositable material, it is preferred to obtain as many advantages as possible from combining and remixing. In general the preferred aims should be to obtain:

1) Higher resistance to moisture than obtained by epoxies, polyimides and bismaleimides.
2) High adhesional strength.
3) Tough non-brittle coatings.
4) High solvent resistance.
5) High temperature resistance.
6) Low cure temperatures (e.g. <210° C.).

What has been discovered is that achieving any significant improvement in one area may come at a cost of lowering the performance in another. For example, the original silicon resin showed excellent resistance to moisture testing but very poor solvent resistance. Adding an epoxy base improved the solvent resistance. However, by the time the material reached a point where the solvent resistance became acceptable, the moisture resistance became unacceptable.

A polymer alloy used as a depositable material in one embodiment of the present invention includes silicon polyester resin, silicon epoxy resin, acrylate and a photoinitiator (SPEA). In very basic terms, the following is the list of attributes associated with each of the basic materials used or possibly used in SPEA:

1) Silicon epoxy lowers cure temperature of the silicon resins, and increases crosslinking over the silicon resins;

2) Silicon polyester again lowers the cure temperature of the silicon resin, and improves the mechanical characteristics of the material (making it tougher);

3) Acrylate, which can only be initiated with a UV initiator/catalyst, has crosslinking that is particularly dense and improves the solvent resistance, and can improve the moisture resistance within the possible cost of brittleness and poor adhesion.

Good performance results have been achieved with the latest generations of SPEA within reliability testing. It is, therefore, believed that SPEA would be a suitable material for forming a passivation body.

While SPEA is a good candidate for passivating a die, there are processing difficulties such as control of this material on certain surface conditions. Specifically, the material is based on a very high level of solvent and small differences in surface finish of the substrate sometimes results in major differences in the wetting and flow of the material. While it is possible to overcome the difficulties in the control of the SPEA, a second layer of material within the process can overcome the problem and add significant benefits for improving the performance of the material sets and processing.

A suitable second material is SPEARi-UVac. SPEARi-UVac encompasses some of the best attributes of each material set. It also brings some advantages over a single film system, the most exciting being remote initialization.

In SPEARi-UVac, the basic SPEA material remains the same as before (silicon polyester resin, silicon epoxy resin and an acrylate) with the photo initiator removed. The addition of the Ri to the end of SPEA (SPEARi) indicates that the acrylate component now requires remote initialization. The UVac material is a fully UV curing acrylate system, which includes extra initiator within the mix. The additional initiator is there for the remote initialization of the SPEARi layer.

The process is as follows:

1) SPEARi is deposited across the entire surface of a substrate that is to be passivated by drop on demand deposition according to the present invention;

2) SPEARi is dried (solvent driven off);

3) UV acrylate is deposited as an image layer on the SPEARi;

4) The UV acrylate is cured by exposure to 365 nM frequency UV light;

5) The SPEARi that has not been coated by the UVac is then developed out;

6) The complete passivation stack is cured.

If the initiator is included in the SPEA layer it would result in the material curing to a degree that would prohibit developing once the substrate had been exposed to UV light. By using the remote initiator in the UV acrylate layer a UV reaction in the SPEARi only occurs in areas that are covered by the UVac layer. The SPEARi layer is dried but uncured at the point of depositing the UVac layer, which means that the UV initiator (if low enough in viscosity) will be drawn into the SPEARi layer.

While the SPEARi is not fully cured, as it needs a thermal cure, the remote initialization means that there is some resistance to solvents, which removes many of the problems associated with layering processes in which only the top layer is cured prior to developing.

The process as described above enables the image printing to be carried out on a controllable surface that is immune to variations in wafer processing, metal finishes and substrate surface conditioning. The two layer system also offers significant performance benefits, which enables a greater flexibility over a single layer system.

Acrylates generally offer a high resistance to moisture and solvents. This is partly due to the high density crosslinking, which is also the reason for the poor performance in adhesion and brittleness. However, the interface between the SPEARi and the UVac has a degree of crosslinking and bonding, which means that the adhesion and brittleness problems are improved over an acrylic laid directly onto the substrate.

The acrylate therefore offers an additional barrier to the attack of moisture and solvents as well as good scratch resistance due to its hard surface. Additionally, in a dual layer system, moisture transportation is generally interrupted by interfaces.

The preferred embodiment as described herein uses a depositable material for forming a passivation body 18 on a semiconductor package component. The semiconductor package component discussed so far is a semiconductor die which may or may not be assembled with other package components. The process as described above is not, however, limited to semiconductor die. A process according to the present invention may, for example, also include depositing a depositable conductive material to form a conductive pattern on a semiconductor package component, such as a leadframe, to form a resistor or an inductor, or a depositable dielectric material to form a dielectric body, for example, for a capacitor. Thus, a process according to the present invention can be used to fabricate a complete semiconductor package, and/or a multi-chip module. For example, as set forth below a complete multi-chip module can be fabricated using a method according to the present invention.

The following summarizes the steps that can be undertaken to fabricate a multi-chip module according to an example of the application of the present invention:

1. Leadframe pre-clean;

2. Deposition of a first dielectric and cure;

3. Deposition of a first electrical conductor and cure;

4. Deposition die attach adhesive;

5. Pick and place die and cure die attach adhesive;

6. Deposition of a second dielectric and cure;

7. Interconnect deposition and cure;

8. Third dielectric deposition and cure;

9. Second level interconnect deposition and cure;

10. Final passivation deposition and cure;

11. Application of conductive stand off;

12. Singulation/Test/T&R.

Detailed description of each process step follows:

1. Leadframe Pre-clean

Prior to the deposition of dielectrics according to the present invention it may be necessary to pre-clean the leadframe. The pre-clean step may be applied to promote adhesion of subsequent dielectrics to the surface. In some cases the pre-cleaning may involve the use of a plasma etch to remove any native oxides or contaminants present on the surface.

Figure 10:
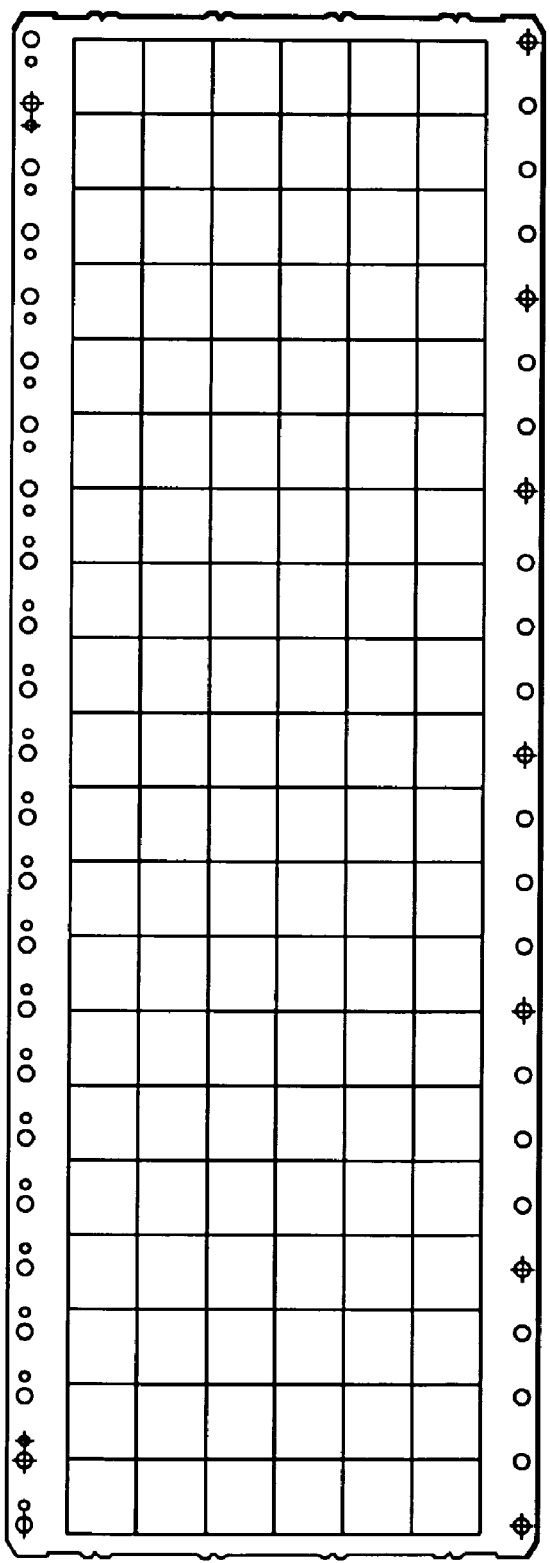
FIG. 10 illustrates a top plan view of a lead frame.

FIG. 10 shows an image of a typical leadframe tape that includes a plurality of individual device positions 40. Typically lead frames have several thicknesses of material present across their surface (e.g. dual gauge). By using the drop on demand deposition according to the present invention it is possible to apply dielectrics in specific regions of the leadframe and create vertical structures raised above the plane of the leadframe. As a result, advantageously, the requirement for a formed leadframe is obviated and it is possible to use a single gauge, non-formed leadframe that costs less than the dual gauge type.

Figure 11:
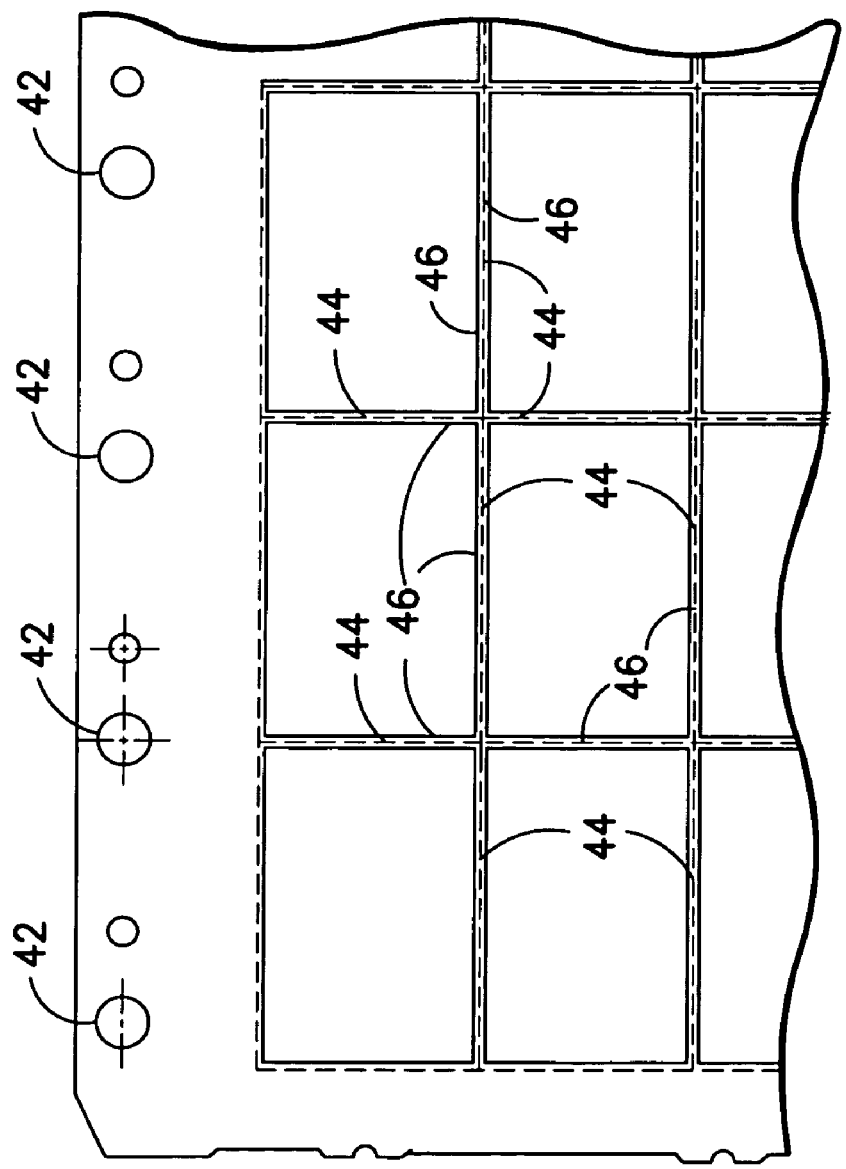
FIG. 11 illustrates an enlarged portion of the lead frame shown in FIG. 10.

A close up of leadframe 40 is shown in FIG. 11. Circular holes 12 present within leadframe 40 enable indexing of leadframe 40 through various manufacturing steps. Leadframe 40 is typically made of OFHC copper or a copper alloy such as KFC or TAMAC4. In order to reduce the stress between subsequent layers and leadframe 40, a leadframe alloy with reduced coefficient of thermal expansion, for example, a copper-molybdenum-copper alloy or stack may be used. In both examples, it is likely that leadframe 40 is coated in a metallic surface to aid adhesion of materials added in the subsequent process steps. For example, leadframe 40 may be coated with nickel silver to alloy die attach materials to form a strong adhesive bond between leadframe 40 and a semiconductor die or package.

With reference to FIG. 11, dashed line regions 44 represent the process area onto which each device is fabricated. Once each device has been processed each individual area bound by the dashed line 44 is sawn or etched to create a package of dimensions highlighted by the solid line 46. The area between the solid line 46 and dashed line 44 is included to accommodate the kerf removed by the saw blade or singulation tool and any positional tolerances associated with the singulation tool. Therefore, the individual rectangles within dashed outlines 44 (illustrated by solid lines 46) represent the finished product dimensions after singulation. By focusing upon a single region represented by each of the rectangles shown in FIG. 11 it is possible to describe how a complete package or multi-chip module may be manufactured using drop on demand deposition.

2. Deposition of First Dielectric

Figure 12:
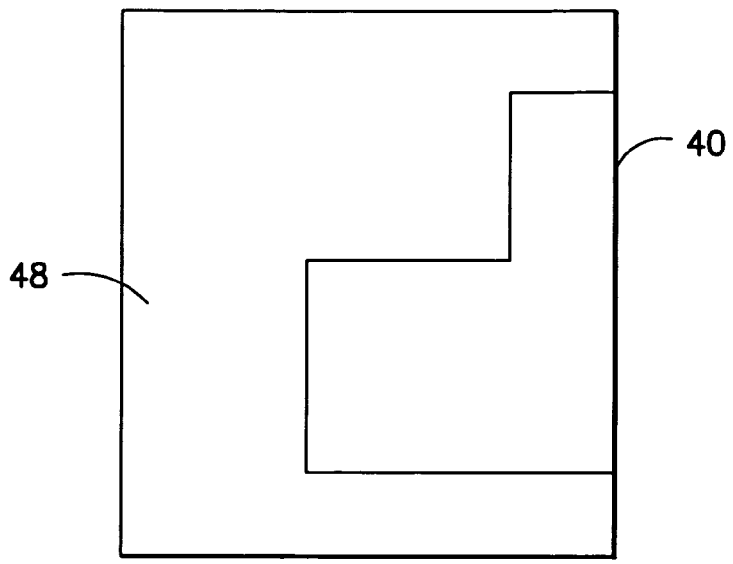
FIGS. 12-22C illustrate a process for fabricating a multichip module using a method according to the present invention.

FIG. 12 shows an individual section of leadframe 40 after deposition of first dielectric layer 48. Dielectric layer 48 forms an electrically isolating layer between subsequent die placed onto the assembly and a leadframe 40. Dielectric layer 48 is deposited using drop on demand deposition according to the present invention.

Dielectric layer 48 may be a modified epoxy, Silicone Polyester Epoxy Acrylate (SPEA), polyimide, benzocyclobutene (BCB), or modified silicone. The dielectric used will in most cases be modified by addition of a solvent such as Toluene, Xylene, Hexane, Heptane, Tetradecane, ET-OH, Mesitylene or water to enable it to pass through the nozzles of a print head 30 (FIG. 9). A typical head used might be a Xaar XJ500 (manufactured by Xaar) or Spectra SEI128. (Manufactured by Spectra owned by Dimatix). Once in the print head the material is typically ejected through application of pressure by a piezoelectric pump or thermoelectric evaporation process onto the leadframe. Droplet sizes may be in the region of 4 to 80 pL. During deposition the leadframe may be heated in order to help dry off the solvent present within the droplet and fix the end material in place. Depending upon the material used a UV or thermal cure may also follow. In some circumstances a UV and thermal cure may be required.

3. First Conductive Material Deposition

In order to create localized, electrically isolated die bond pads a conductive material is deposited upon first dielectric 48 using drop on demand deposition according to the present invention. Note that in this same step a die bond pad may be deposited with a trace that redistributes the die bond pad to another location in the package.

To deposit a first conductive layer a modified industrial print head, such as the Xaar XJ500 or Spectra SE128 described above can be used to deposit a metal particle based solution. In order to improve the thermal dissipation and reduce electrical parasitic resistance within the device it is beneficial to have a high loading of metallic particles within the solution. Examples of such materials include Cabot AG-IJ-G-100-S1 or Harima NPS-J or NPG-J. Ideally the particle material is silver, silver coated copper or gold. Silver filler particles originates are preferred to produce a layer that is able to form a strong bond to the silver filled die attach materials utilized in subsequent process stages. Typically the particle diameters falls into the range of 2 to 30 nm. Upper size limits on the metal particle size are fixed by the nozzle diameter of the print head. In order to reduce the electrical resistance nano-particles containing inks offer some of the lowest resistivity and highest thermal conductivity values. These materials may also be utilized as die attach adhesives which may eliminate the requirement for separate die attach and first conductive layer deposition.

One additional benefit of using nanoparticle based metallic inks is that their curing or sintering temperatures are significantly lower than conventional fired metallic inks, typically falling in the range of 150° to 300° C. Fired inks typically have sintering temperatures of 650° C. and above.

Figure 13:
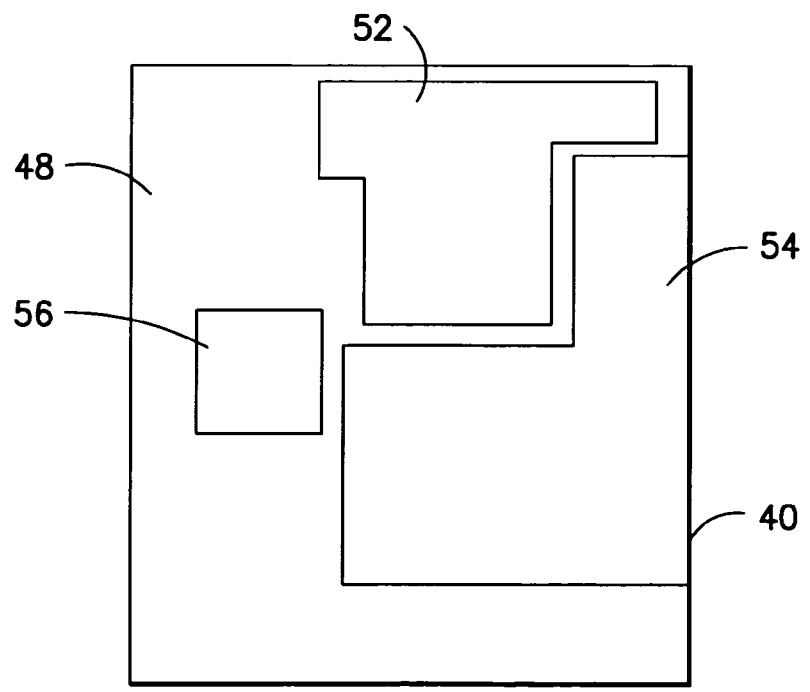

Referring to FIG. 13, once the first conductive material is deposited onto the dielectric, it is thermally cured to fix its position and bind the particles together. FIG. 13 shows an image of the deposited first conductive material on top of dielectric layer 48. As seen, three conductive pad areas 52, 54, 56 are created on leadframe 40 that can be populated with die. Pad 52 and pad 56 are electrically isolated from the leadframe while pad 54 is in direct contact with leadframe 40. The ability to isolate die within a package is of particular benefit in multi-chip power devices packages containing, for example, an IC in that in certain cases it is essential to isolate low voltage transistors such as control ICs from high voltage transistors such as power diodes, MOSFETs or IGBTs.

Using a method according to the present invention other drop on demand conductive materials may be deposited to form pads or tracks and finished with a drop on demand or screen printable barrier metal (e.g., Ni, pd, or pt) and solderable finishes (e.g. solder, silver or tin). For example, nickel tracks can be deposited according to the present invention and coated with a drop on demand solderable pad. For example, nickel may be coated with a silver. It should be noted that to deposit nickel, silver or any other metal using drop on demand an ink containing the material can be used as the drop on demand depositable material. The ink can then be treated (e.g. through drying and/or curing steps) to form the pad, tracks or the like after the deposition. Nickel may be used where parasitics are less critical (e.g. serving as IC interconnection).

4. Deposit Die Attach Adhesive

Once die bond pads 52, 54, 56 have been patterned it is necessary to attach die to the pads. This can be done using either a conductive film die attach material pre-applied to the die (for example Ableflex 8007), or a silver filled epoxy die attach material such as Ablestik 84-1 LMSR4 or Ablestik 8352L. Solder and Silver nanopaste based materials may also be utilized in this capacity.

Where conventional die attach adhesives are used (e.g. Ablestik 84-1 LMSR4), the application method is pressure-time or positive displacement dispense. This process is incorporated into die bond and pick and place equipment. It should be noted that alternative process such as screen-printing or use of drop on demand deposition according to the present invention may also be used to apply die attach adhesive.

Figure 14:
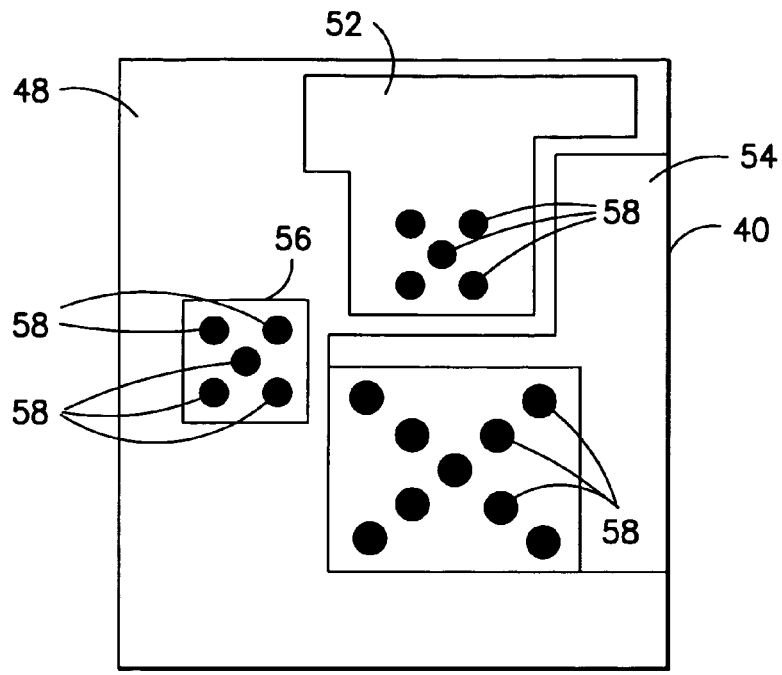

FIG. 14 shows die attach adhesive 58 applied to pads 52, 54, 56. Note that the die attach material in this case may be silver filled epoxy.

5. Pick and Place Die and Cure Die Attach Adhesive

Figure 15:
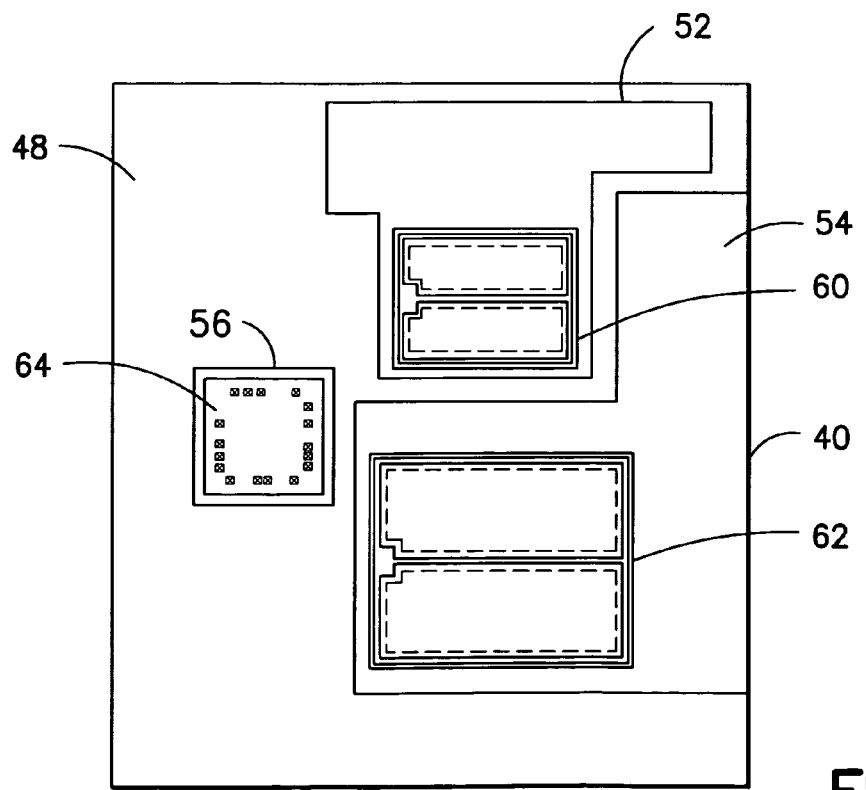

Referring to FIG. 15, once the die attach adhesive has been deposited, specific die are picked from a carrier tape and placed upon adhesive 58 in a die bond operation. In this specific example, three different die are placed within the package. These can be International Rectifier's IRF6623 control Power MOSFET 60, IRF6620 synchronous power MOSFET 62 and IRF3505 single-phase gate driver IC 64 dies. Once placed the assembly is cured at approximately 150° C. to 200° C. for 30 minutes to 1 hr. The combination of the die used according to the example set forth herein will enable a single phase voltage regulator module.

6. Deposition of the Second Dielectric and Cure

Figure 16:
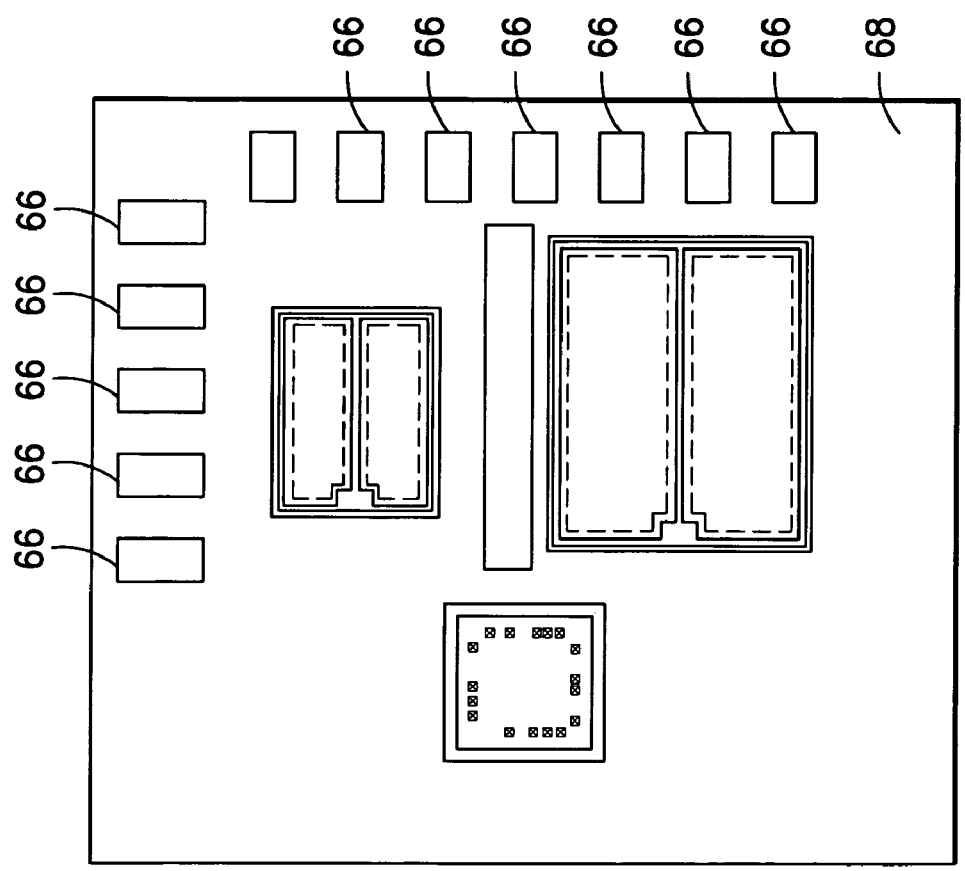
Figure 17:
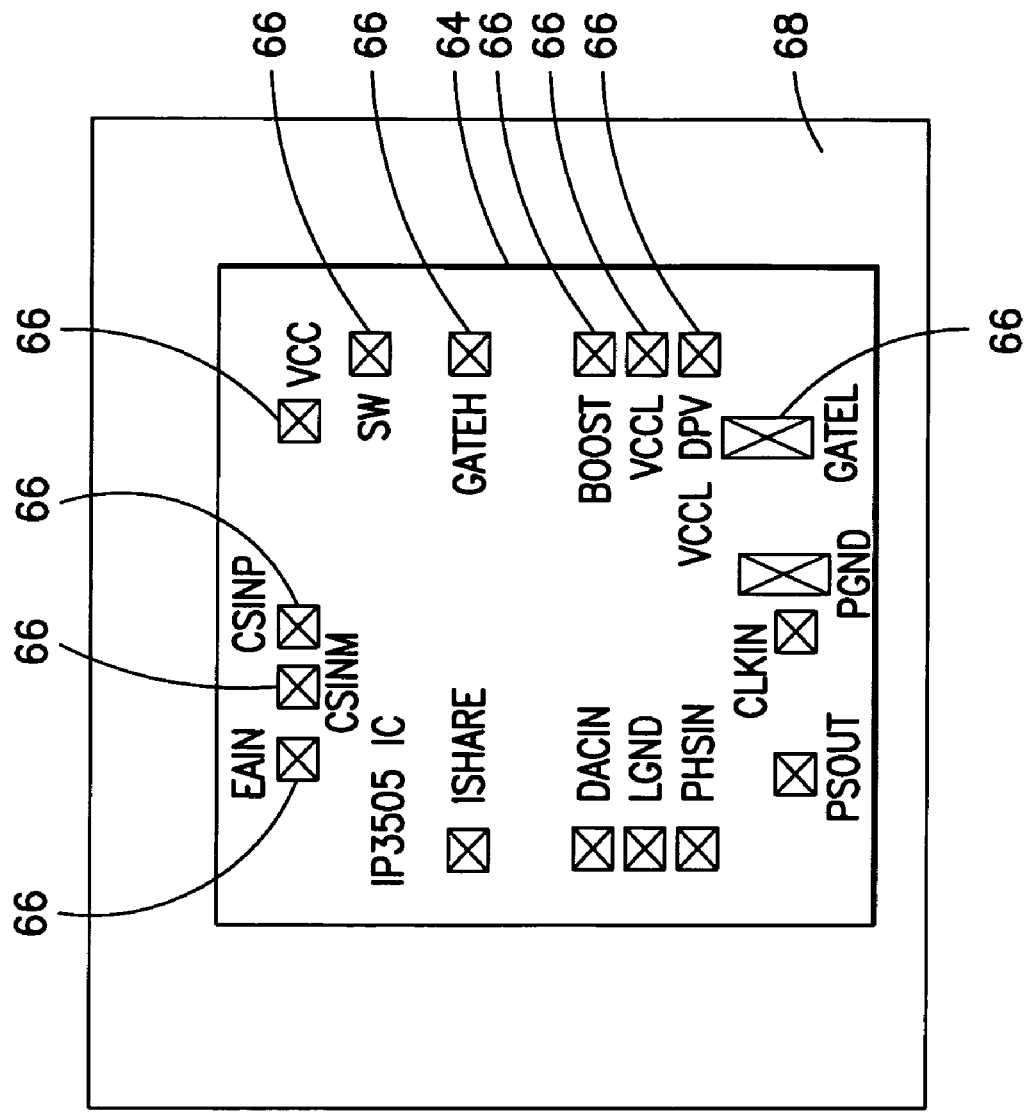
Figure 18:
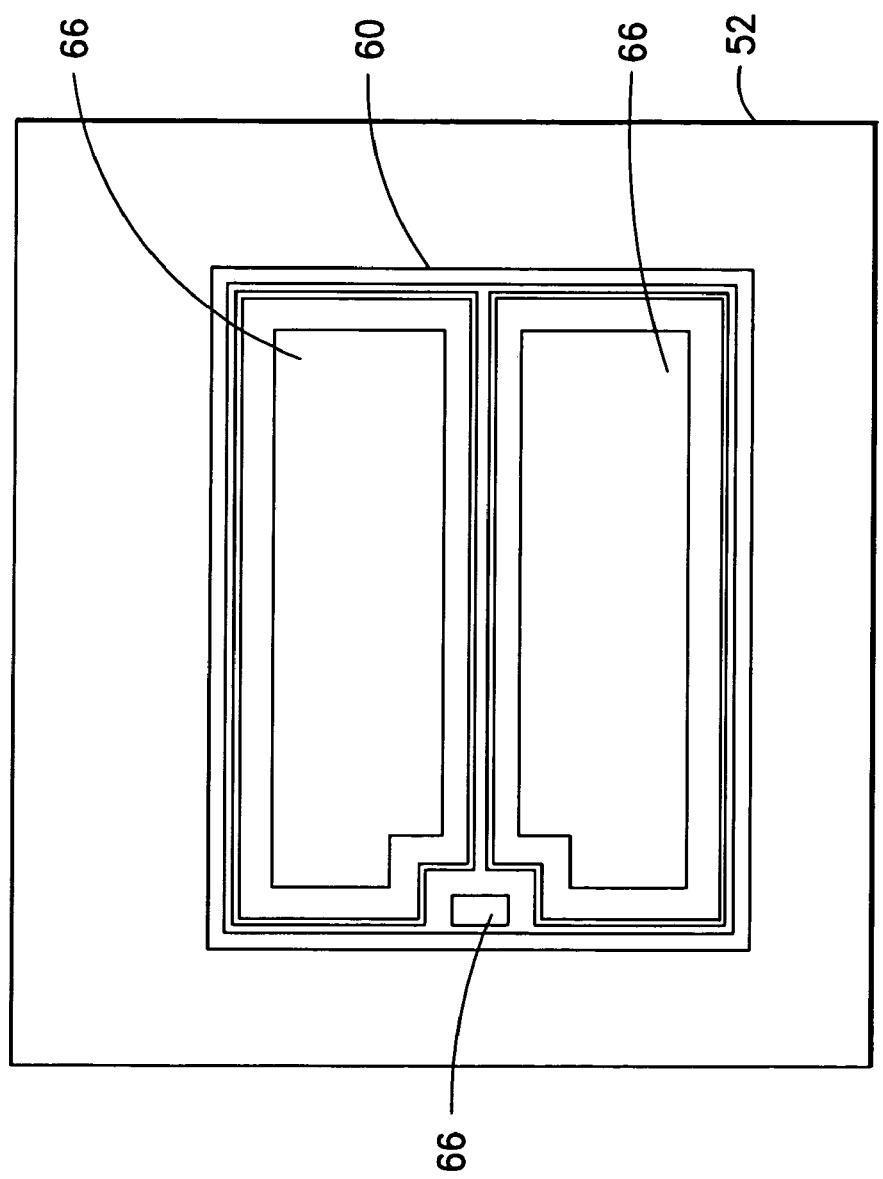

Once the die attach adhesive has cured a second passivation layer is applied to act as a leveler that helps planarise the top surface of the assembly. Second dielectric layer 68 can be applied using drop on demand deposition according to the present invention. The material is deposited using a print head (for example Xaar XJ-500) in a system similar to that shown in FIG. 9. When applying second dielectric layer 68 the pattern recognition of the jet head positioning system must be able to recognize and compensate for any rotation, or x-y re-positioning of the semiconductor die that may occur during the previous step of die placement and cure. The process results in deposition of the dielectric across the entire surface of the assembly with the exception of regions 66 that are to be electrically connected in later stages of the process (i.e. pads on the semiconductor die) as illustrated in FIGS. 16, 17 and 18.

The material used for second dielectric layer 68 can be a modified epoxy, Silicone Polyester Epoxy Acrylate (SPEA), polyimide, benzocyclobutene (BCB) or modified silicone materials. In order to improve the thermal conductivity of the dielectric it may be necessary to fill the dielectric with Boron Nitride, AlN or similar thermally conductive fillers. In each case, the diameter of the conductive fillers can be of the order of 3 nm to 21 µm and sufficiently small to be deposited through the head of a drop on demand system. If the resultant thickness of the dielectric material is greater than say 100 µm it may be necessary to apply the dielectric in several passes of the jet head over the substrate.

Once deposited, the second dielectric material is cured. Curing temperature is typically in the range of 150° to 200° C. for epoxy based systems and 200° C. to 300° C. for silicone based materials. In some cases a UV fixing agent is added to the dielectric material. In this case, once the material has been deposited, the thermal cure stage is preceded by a brief exposure to UV light.

In circumstances in which the secondary dielectric leaches residue onto uncoated electrodes an additional clean, rinse and dry stage is required. The additional cleaning removes all residues and ensures the electrodes are sufficiently clean prior to the interconnect deposition. Note that, alternatively, the second passivation may be deposited using other methods such as screen printing, stencil printing or extension.

7. Interconnect Deposition and Cure

Figure 19:
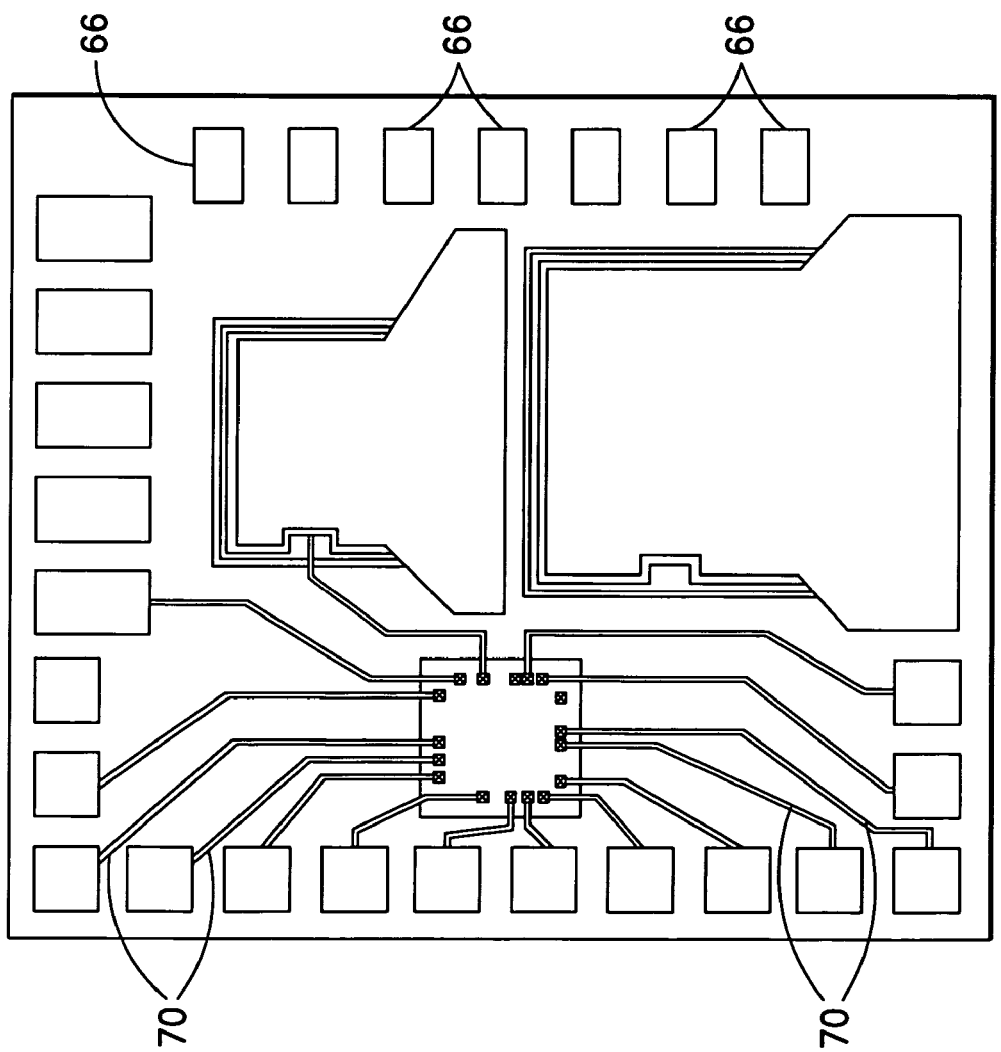

Referring to FIG. 19, following the cure of the second dielectric layer 68, conductive traces 70 are deposited on the assembly to provide electrical connections between the power device die 60, 62, IC die 64 and pad areas that will form electrical connections to the end user's circuit board or carrier. Traces 70 can be deposited using drop on demand deposition according to the present invention.

Traces 70 are formed by depositing conductive 'inks' upon the surface of the assembly using an industrial ink jet head. Examples of the heads used may include a Xaar XJ-500 for example or modified print heads from HP or Epson. The drop on demand system used is similar to that highlighted in FIG. 9. In this stage, however, data is read into the computer controller to identify the precise locations of the IC pads. As mentioned in section 6, the IC and power devices may be subject to positional variation in the x and y axis. The drop on demand system should compensate for any variation in the electrode positions by repositioning the head and applying small modifications to the trace routing. The modifications may include reducing/increasing the length of the track, modifying the angle of the trace relative to the x or y axis, or increasing or reducing the area of the conductive track.

FIG. 19 shows an image of the assembly after the conductive traces have been applied. During the deposition, peripheral pad regions are created and wired to the IC pads. Larger area tracks are used to interconnect the source electrodes on the power devices 60, 62 to leadframe 40 and the pads respectively. The conductive material ideally has low resistivity, preferably close to pure silver or copper. Typical materials are similar to first conductive material described in section 3. Once deposited, conductive trace materials are cured to dry off solvents and fix tracks in place upon the assembly.

8. Third Dielectric Deposition and Cure

Figure 20:
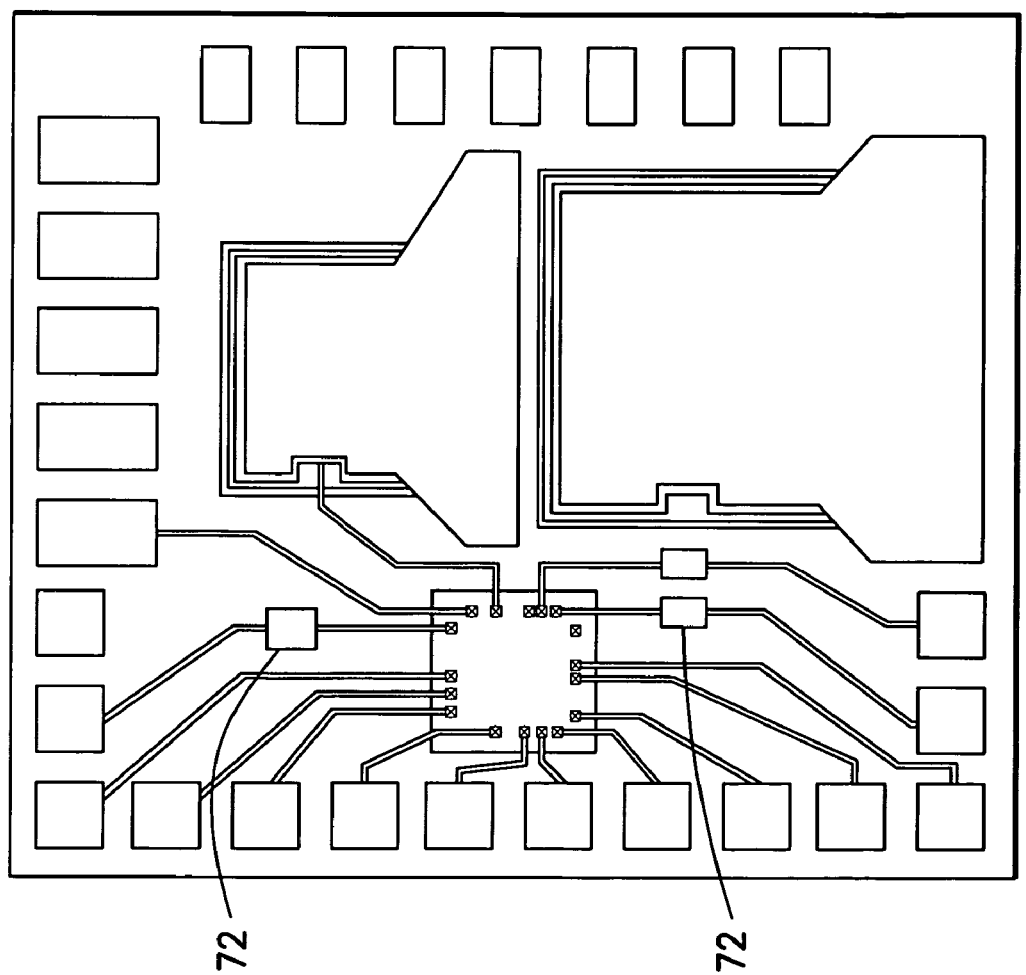

With reference to FIG. 19 it is not always possible to route the electrodes on the IC to peripheral pads without crossing conductive traces connecting other pads. Two of the IC pads shown in FIG. 19 demonstrate this phenomenon. A solution to this problem is to use drop on demand deposition to apply a small area of dielectric (third dielectric) over traces that need to be "bridged" by other tracks. This is shown in FIG. 20. The bridging dielectric 72 material will be similar if not identical to that used to form the second dielectric described in section 6.

9. Second Level Interconnect Deposition and Cure

Figure 21:
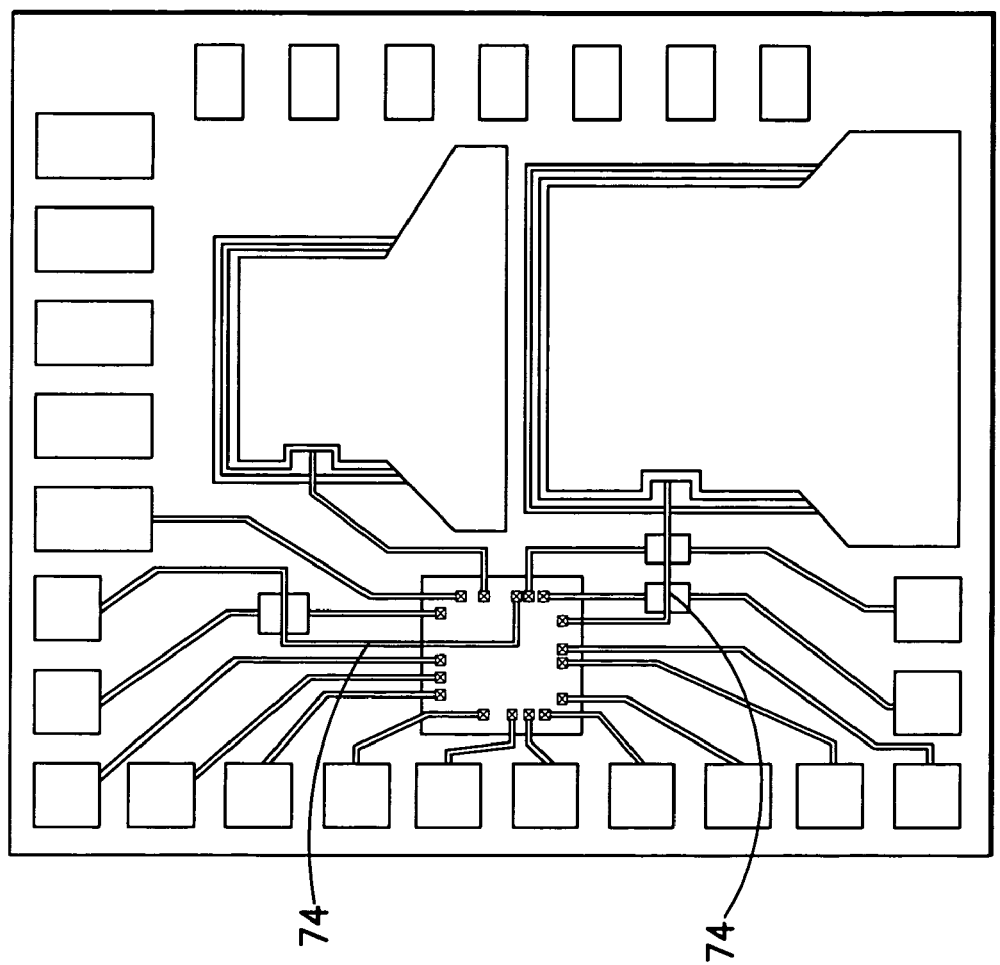

Once dielectric "bridges" 72 are in place, a second pass through the drop on demand deposition system completes the connection of all electrode pads on IC 64 to their designated pads on the periphery of the assembly or to the electrodes on power die 60, 62. The completed routing 24 is shown in FIG. 21. Once deposited the dielectric is cured to dry off solvents and fix the traces in place.

It may also be possible to run both conductive trace 70 and dielectric bridges 72 on the same printer with separate reservoirs for each material. Thus, the bridge and "wiring" could be achieved in a single process step, which would require the "bridge" dielectric to be fully curable in situ (e.g. by using a UV cure) or have a similar cure schedule to the conductive ink. If both ink and wire materials are cured in one stage it is also important that metallic particles within the ink do not penetrate through the bridge and compromise the dielectrics ability to isolate adjacent tracks.

10. Final Passivation and Deposition Cure

Figure 22A:
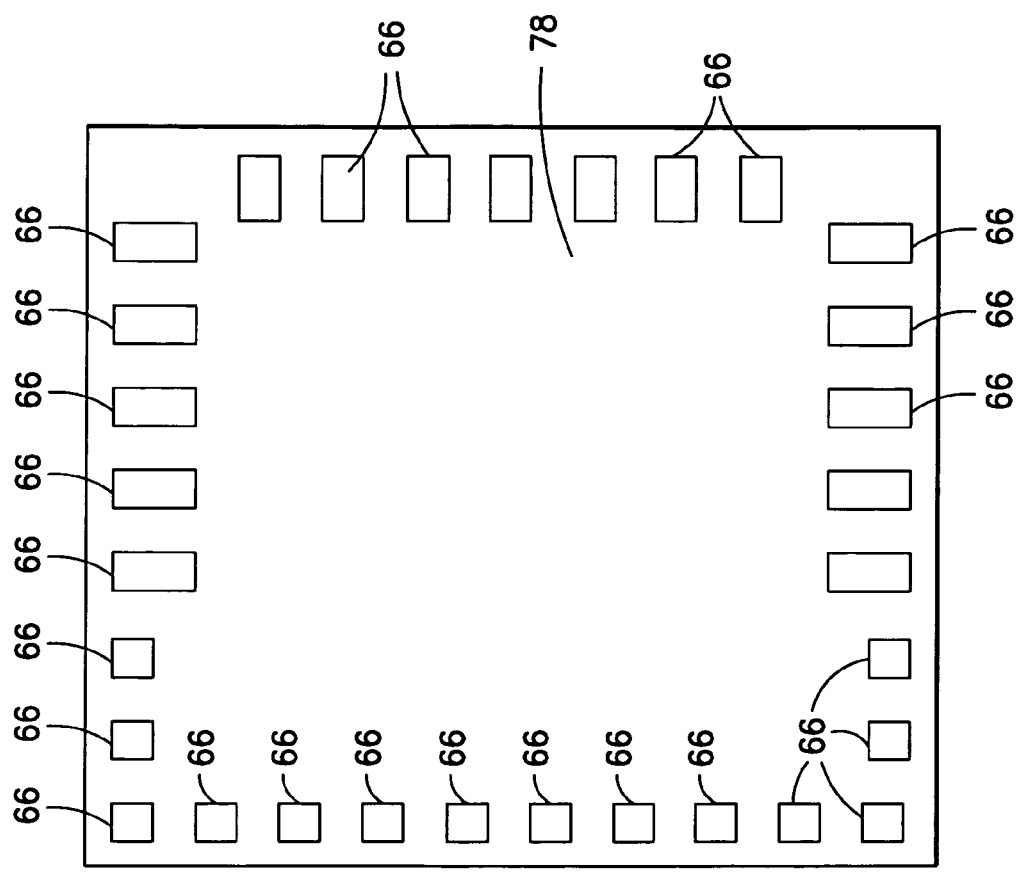

Referring to FIG. 22A, conductive traces formed across the surface of the assembly need to be protected from the end user's processing steps, e.g. soldering, re-flow, cleaning and the end user's operating environment. Thus, a final passivation layer 76 is added to the die surface as an environmental barrier. This layer is typically an epoxy based material or a Silicone Polyester Epoxy Acrylate (SPEA), polyimide, benzocyclobutene (BCB) or modified silicone. The material may be deposited using drop on demand deposition according to the present invention. The passivation material coats the entire surface of the assembly with the exception of pad areas 66 that are to be soldered down to an end customer's circuit board or module. The deposition process is then followed by a thermal cure. Depending upon the passivation material used the passivation cure process step may be preceded by a UV fixing step.

11. Application of Solder Alloy Based Conductive Stand-Off Material

Figure 22B:
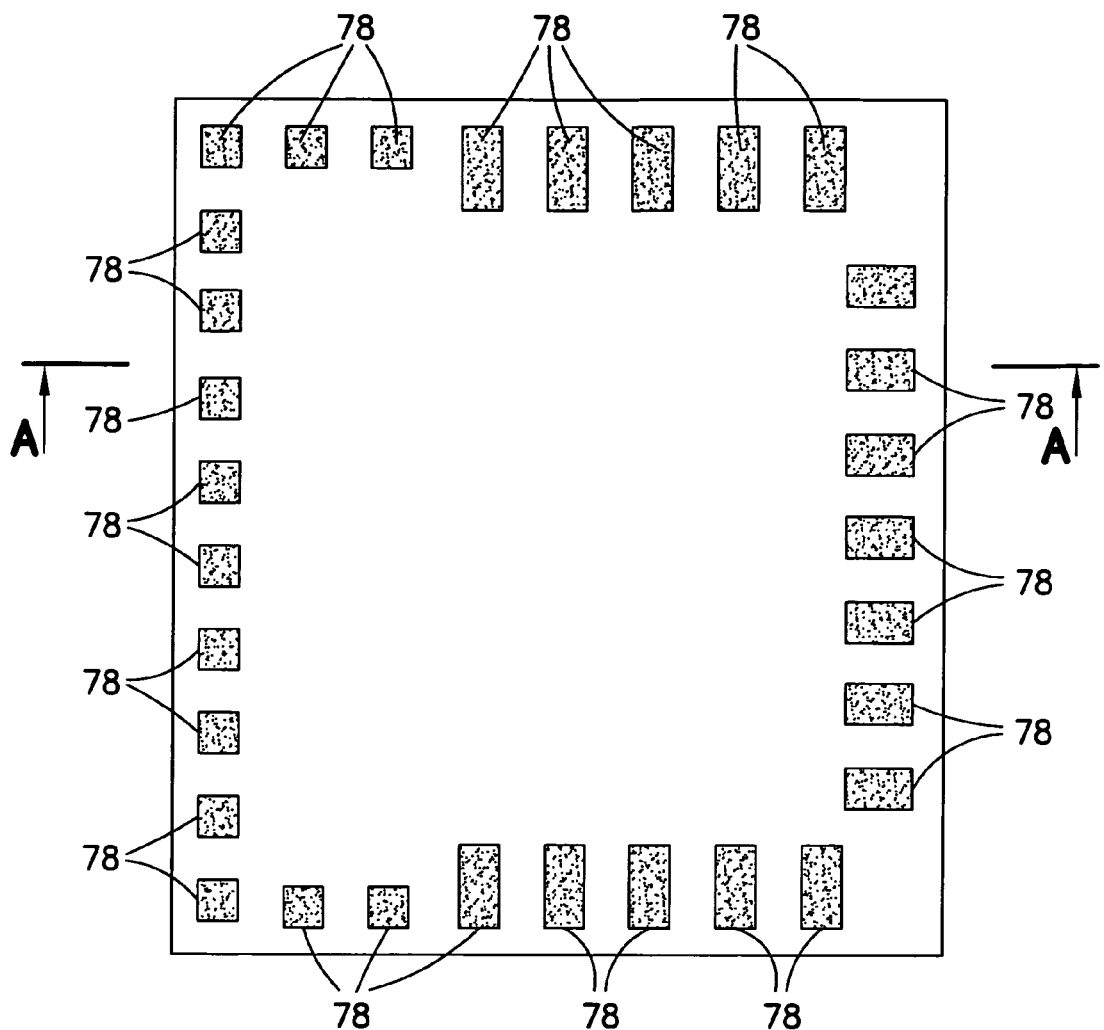
Figure 22C:
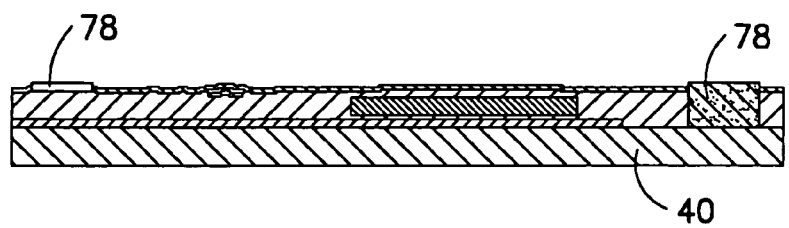

Once the final passivation stage has been cured a solder alloy material is deposited onto the peripheral pads of the assembly using a modified solder stencil. The preferred material consists of a SnAgCu alloy containing nickel spheres. Further details of this material can be found in copending U.S. application Ser. No. 10/970,557, assigned to the assignee of the present application the entire contents of which is incorporated by reference. The purpose of the solder alloy is to provide an array of solderable contacts 78 along the periphery of the assembly, where each individual contact surface is the same height relative to the surface of leadframe 40. FIG. 22B shows an image of the assembly with the solder alloy applied along the periphery of leadframe 40.

Figure 23:
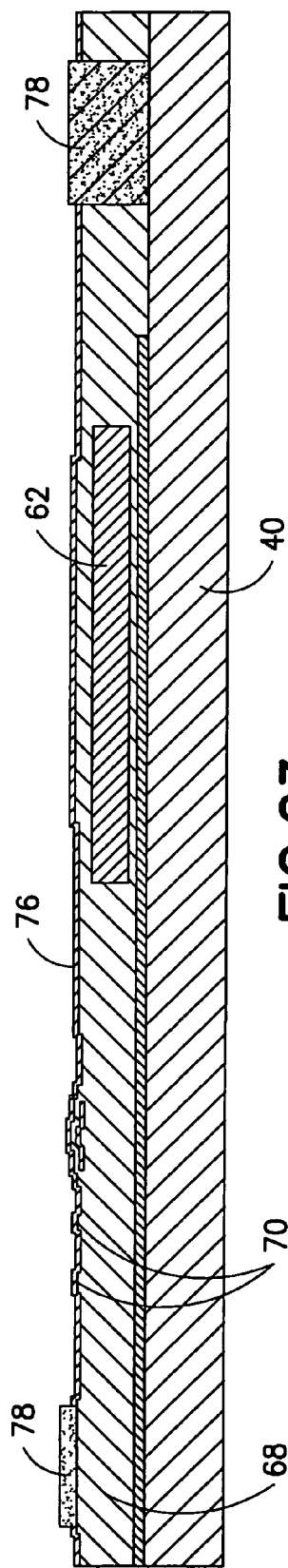
FIGS. 23-25 illustrate cross-sectional views of the multichip module shown by FIG. 22B.
Figure 24:
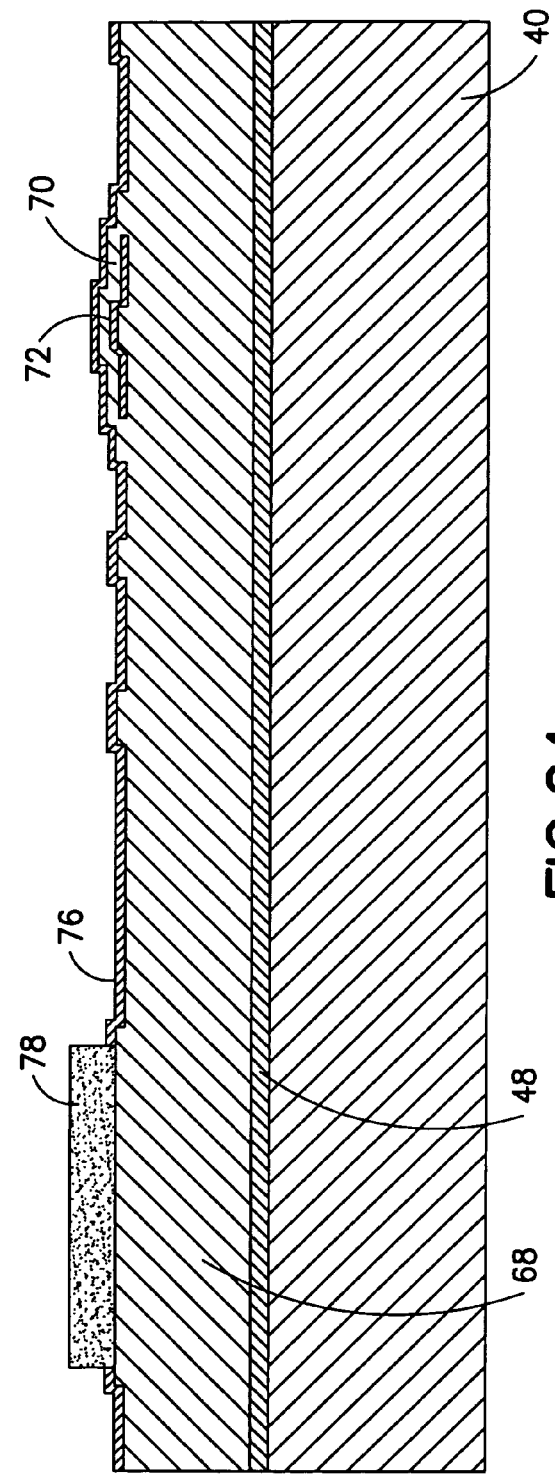
Figure 25:
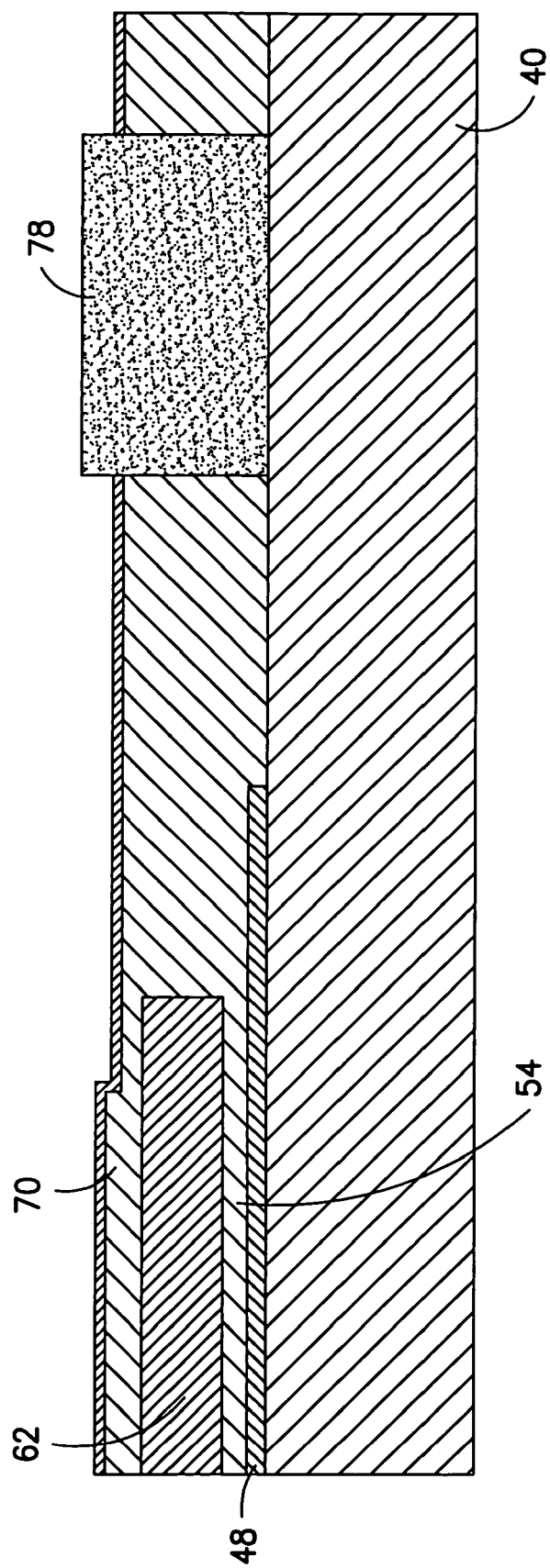

A close up of the assembly shown in FIG. 22B is shown in FIGS. 23, 24 and 25. The sections show the solder alloy standoffs 78, die 62, all dielectrics used and regions where metal filled traces on the assembly surface bridge one another. Solder alloy standoffs 78 include conductive particles glued together by a solder matrix as described in U.S. application Ser. No. 10/970,557.

Note that a Ni barrier material can be drop on demand deposited according to the present invention on the pads to prevent the consumption by solder at a later stage. Once the Ni has been deposited an additional solderable layer (e.g. Ag) may be drop on demand deposited to prevent the Ni from oxidizing. Thereafter, the solder alloy standoff may be formed. Thus, for example, to prevent the silver contained in a deposited pad from being consumed by the solder, a nickel barrier can be deposited atop the conductive pad to act as a barrier. A silver containing solderable body can then be formed on the nickel barrier body in order to render the same better capable of receiving solder.

Alternatively screen printable nickel and silver thick film pastes may be applied to the pads in lieu of the drop on demand depositable materials prior to forming the standoffs.

It should be noted here that alternate materials including nano-particle filled pastes may also be suitable candidates for coating the peripheral pads of the assembly.

12. Singulation/Test/Laser Mark/T&R

Once the final solderable contacts have been applied, the assemblies undergo a combination of singulation, test, and laser mark. Finally devices go into tape and reel for shipment to customers.

Device singulation may be carried out using any known process or known combination of processes. Typical examples include conventional sawing with a rotary blade, stamping, V-scoring, laser cutting/ablation and abrasive media water jet sawing. Stamping is preferred due to its low cost. It is likely that the singulation, test and tape and reel processes will be performed on one piece of equipment to reduce manufacturing floor space and to increase throughput.

In addition to the functions set forth above, pattern recognition system 34 (FIG. 9) used to control the drop on demand delivery to fabricate a multi-chip module ideally has the following functions:

1) It is programmable to recognize and store the location of the semiconductor device die electrodes with respect to reference points on the die.

2) It is able to recognize and store the position and orientation of each die relative to the tooling holes or alignment marks on the leadframe or carrier.

3) It is able to recognize and store the position and orientation of each die relative to exposed areas of leadframe or pads on the leadframe or carrier.

4) It is able to recall the exact position of each electrode on every die placed upon the leadframe or carrier for use in consequent drop on demand process stages (such as processes described in section 7).

5) It is able to input die and pad position data from stand alone pattern recognition equipment.

6) It is able to compare actual pad position data input with the inputted design data (e.g. Gerber file) and modify print lengths, positions or volumes to compensate for translation, rotation, tilt or accumulative tolerance errors in the assembly.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A method of preparing a semiconductor package comprising:
   identifying a reference mark on a semiconductor package component;
   positioning a drop on demand head capable of depositing drop depositable material based on said identified reference mark; and
   depositing said depositable material on a surface of said semiconductor package component to realize a pattern.

2. The method of claim 1, wherein said semiconductor package component is a semiconductor die.

3. The method of claim 2, wherein said semiconductor die is a part of a semiconductor wafer.

4. The method of claim 1, wherein said semiconductor package component is a MOSFET, an IGBT, a diode, a HEMT, a bipolar transistor, a JFET, or an integrated circuit.

5. The method of claim 1, wherein said depositable material is a dielectric.

6. The method of claim 1, wherein said depositable material is an electrically conductive material.

7. The method of claim 1, wherein said semiconductor package component is a portion of a lead frame.

8. The method of claim 1, wherein said semiconductor package component is a conductive can.

9. The method of claim 1, wherein said depositable material is a polymer alloy.

10. The method of claim 9, wherein said polymer alloy includes a silicon epoxy.

11. The method of claim 9, wherein said polymer alloy includes a silicon polyester.

12. The method of claim 9, wherein said polymer alloy includes an acrylate.

13. The method of claim 1, wherein said depositable material includes an organopolysiloxane.

14. The method of claim 1, wherein said semiconductor package component is part of a multi-chip module.

15. A method for fabricating a semiconductor device comprising:
    forming a conductive body, said conductive body including a material susceptible to consumption by a solder;
    depositing a barrier atop said conductive body, said barrier being capable of preventing the consumption of said material that is susceptible of consumption; and
    depositing a solderable body atop said barrier; wherein said barrier is deposited through a drop on demand process, or said barrier is screen printed.

16. The method of claim 15, wherein said material susceptible of consumption comprises silver.

17. The method of claim 15, wherein said barrier comprises nickel.

18. The method of claim 15, wherein said solderable body includes silver.

19. The method of claim 15, wherein said barrier is comprised of nickel, and said solderable body is comprised of silver.

20. The method of claim 15, wherein said material susceptible of consumption is silver, said barrier is comprised of nickel, and said solderable body includes silver.

21. A method of fabricating an MCM comprising:
    drop on demand depositing conductive tracks and dielectric bodies on a leadframe to form an integrated circuit body capable of receiving semiconductor devices; and
    drop on demand depositing of identifying indicia on said leadframe.

22. The method of claim 21, wherein said indicia includes part number or date of fabrication.

* * * * *